(12) United States Patent
Jeong

(10) Patent No.: US 8,871,542 B2
(45) Date of Patent: Oct. 28, 2014

(54) METHOD OF MANUFACTURING ORGANIC LIGHT EMITTING DISPLAY APPARATUS, AND ORGANIC LIGHT EMITTING DISPLAY APPARATUS MANUFACTURED BY USING THE METHOD

(75) Inventor: Dong-Seob Jeong, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 22 days.

(21) Appl. No.: 13/279,077

(22) Filed: Oct. 21, 2011

(65) Prior Publication Data

US 2012/0097992 A1 Apr. 26, 2012

(30) Foreign Application Priority Data

Oct. 22, 2010 (KR) .................. 10-2010-0103679

(51) Int. Cl.
| | | |
|---|---|---|
| H01L 21/00 | (2006.01) | |
| H01L 21/31 | (2006.01) | |
| H01L 21/469 | (2006.01) | |
| H01L 51/56 | (2006.01) | |
| H01L 51/00 | (2006.01) | |
| H01L 51/52 | (2006.01) | |

(52) U.S. Cl.
CPC ......... *H01L 51/0011* (2013.01); *H01L 51/5253* (2013.01); *H01L 2227/323* (2013.01); *H01L 51/56* (2013.01)
USPC ...................... 438/34; 257/E27.131; 438/780

(58) Field of Classification Search
USPC ........ 257/59, 72, 88, 291, E27.131, E27.132, 257/E27.135; 438/34, 73, FOR. 287
See application file for complete search history.

(56) References Cited

U.S. PATENT DOCUMENTS

| | | | |
|---|---|---|---|
| 4,416,217 A | 11/1983 | Nakamura et al. | |
| 4,468,648 A | 8/1984 | Uchikune | |
| 4,687,939 A | 8/1987 | Miyauchi et al. | |

(Continued)

FOREIGN PATENT DOCUMENTS

| | | |
|---|---|---|
| CN | 1476279 A | 2/2004 |
| CN | 1489419 A | 4/2004 |

(Continued)

OTHER PUBLICATIONS

Machine translation of JP 11-144865, Published May 28, 1999, 32 pgs.

(Continued)

*Primary Examiner* — William F Kraig
*Assistant Examiner* — Khaja Ahmad
(74) *Attorney, Agent, or Firm* — Christie, Parker & Hale, LLP

(57) ABSTRACT

A method of manufacturing an organic light emitting display device and an organic light emitting display device manufactured using the method, which are suitable for manufacturing large-sized display devices on a mass scale and can be used for high-definition patterning. The method includes consecutively forming organic layers on a substrate on which a plurality of panels are arranged parallel to each other; forming a second electrode on the organic layers, for each of the panels; forming a passivation layer on the second electrode on each of the panels to cover the second electrode; and removing a part of the organic layers that exists between the passivation layer on the second electrode of one of the panels and the passivation layer on the second electrode of an adjacent one of the panels.

21 Claims, 9 Drawing Sheets

(56) References Cited

U.S. PATENT DOCUMENTS

| | | |
|---|---|---|
| 4,792,378 A | 12/1988 | Rose et al. |
| 4,901,667 A | 2/1990 | Suzuki et al. |
| 5,454,847 A | 10/1995 | Jacoboni et al. |
| 5,460,654 A | 10/1995 | Kikkawa et al. |
| 5,487,609 A | 1/1996 | Asada |
| 5,742,129 A | 4/1998 | Nagayama et al. |
| 5,909,995 A | 6/1999 | Wolf et al. |
| 6,045,671 A | 4/2000 | Wu et al. |
| 6,091,195 A | 7/2000 | Forrest et al. |
| 6,099,649 A | 8/2000 | Schmitt et al. |
| 6,274,198 B1 | 8/2001 | Dautartas |
| 6,280,821 B1 | 8/2001 | Kadunce et al. |
| 6,371,451 B1 | 4/2002 | Choi |
| 6,417,034 B2 | 7/2002 | Kitazume et al. |
| 6,443,597 B1 | 9/2002 | Natori |
| 6,483,690 B1 | 11/2002 | Nakajima et al. |
| 6,541,130 B2 | 4/2003 | Fukuda |
| 6,554,969 B1 | 4/2003 | Chong |
| 6,579,422 B1 | 6/2003 | Kakinuma |
| 6,589,673 B1 | 7/2003 | Kido et al. |
| 6,650,023 B2 | 11/2003 | Kim |
| 6,699,324 B1 | 3/2004 | Berdin et al. |
| 6,749,906 B2 | 6/2004 | Van Slyke |
| 6,776,847 B2 | 8/2004 | Yamazaki et al. |
| 6,837,939 B1 | 1/2005 | Klug et al. |
| 6,878,209 B2 | 4/2005 | Himeshima et al. |
| 6,946,783 B2 | 9/2005 | Kim |
| 6,995,035 B2 | 2/2006 | Cok et al. |
| 7,006,202 B2 | 2/2006 | Byun et al. |
| RE39,024 E | 3/2006 | Takahashi |
| 7,078,070 B2 | 7/2006 | Peng |
| 7,199,520 B2 | 4/2007 | Fujii et al. |
| 7,282,855 B2 | 10/2007 | Park et al. |
| 7,322,248 B1 | 1/2008 | Long |
| 7,495,389 B2 | 2/2009 | Noguchi et al. |
| 7,601,439 B2 | 10/2009 | Chun et al. |
| 7,776,457 B2 | 8/2010 | Lee et al. |
| 7,872,256 B2 | 1/2011 | Sung et al. |
| 7,910,386 B2 | 3/2011 | Shiang et al. |
| 7,964,037 B2 | 6/2011 | Fukuda et al. |
| 8,022,448 B1 | 9/2011 | Luu et al. |
| 8,128,753 B2 | 3/2012 | Bulovic et al. |
| 8,137,466 B2 | 3/2012 | Kang et al. |
| 8,188,476 B2 | 5/2012 | Takagi et al. |
| 8,193,011 B2 | 6/2012 | Kang et al. |
| 2001/0004186 A1 | 6/2001 | Song et al. |
| 2001/0006827 A1 | 7/2001 | Yamazaki et al. |
| 2001/0019807 A1 | 9/2001 | Yamada et al. |
| 2001/0026638 A1 | 10/2001 | Sangu et al. |
| 2001/0034175 A1 | 10/2001 | Miyazaki et al. |
| 2002/0011785 A1 | 1/2002 | Tang et al. |
| 2002/0017245 A1 | 2/2002 | Tsubaki et al. |
| 2002/0033136 A1 | 3/2002 | Savage et al. |
| 2002/0036759 A1 | 3/2002 | Ise et al. |
| 2002/0050061 A1 | 5/2002 | Komyoji et al. |
| 2002/0076847 A1 | 6/2002 | Yamada et al. |
| 2002/0168577 A1 | 11/2002 | Yoon |
| 2002/0179013 A1 | 12/2002 | Kido et al. |
| 2002/0187253 A1 | 12/2002 | Marcus et al. |
| 2002/0194727 A1 | 12/2002 | Cho et al. |
| 2002/0197393 A1 | 12/2002 | Kuwabara |
| 2003/0021886 A1 | 1/2003 | Baele |
| 2003/0101932 A1 | 6/2003 | Kang |
| 2003/0101937 A1 | 6/2003 | Van Slyke et al. |
| 2003/0117602 A1 | 6/2003 | Kobayashi et al. |
| 2003/0118950 A1 | 6/2003 | Chao et al. |
| 2003/0124764 A1 | 7/2003 | Yamazaki et al. |
| 2003/0151637 A1 | 8/2003 | Nakamura et al. |
| 2003/0164934 A1 | 9/2003 | Nishi et al. |
| 2003/0168013 A1 | 9/2003 | Freeman et al. |
| 2003/0173896 A1 | 9/2003 | Grushin et al. |
| 2003/0221614 A1 | 12/2003 | Kang et al. |
| 2003/0221620 A1 | 12/2003 | Yamazaki |
| 2003/0232563 A1 | 12/2003 | Kamiyama et al. |
| 2004/0016907 A1 | 1/2004 | Shi |
| 2004/0029028 A1 | 2/2004 | Shimizu |
| 2004/0056244 A1 | 3/2004 | Marcus et al. |
| 2004/0086639 A1 | 5/2004 | Grantham et al. |
| 2004/0096771 A1 | 5/2004 | Kashiwagi et al. |
| 2004/0115338 A1 | 6/2004 | Yoneda |
| 2004/0115342 A1 | 6/2004 | Shigemura |
| 2004/0123804 A1 | 7/2004 | Yamazaki et al. |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0183435 A1 | 9/2004 | Ohshita |
| 2004/0194702 A1 | 10/2004 | Sasaki et al. |
| 2004/0195530 A1 | 10/2004 | Kwak et al. |
| 2004/0216673 A1 | 11/2004 | Sakata et al. |
| 2004/0255857 A1 | 12/2004 | Chow et al. |
| 2004/0263547 A1 | 12/2004 | Sugahara |
| 2004/0263771 A1 | 12/2004 | Jeong et al. |
| 2005/0001546 A1 | 1/2005 | Yamaguchi |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0039684 A1 | 2/2005 | Yi et al. |
| 2005/0072359 A1 | 4/2005 | Kim |
| 2005/0072361 A1 | 4/2005 | Yang et al. |
| 2005/0079418 A1 | 4/2005 | Kelley et al. |
| 2005/0110400 A1 | 5/2005 | Nakamura |
| 2005/0129489 A1 | 6/2005 | Quan et al. |
| 2005/0153472 A1 | 7/2005 | Yotsuya |
| 2005/0166842 A1 | 8/2005 | Sakamoto |
| 2005/0166844 A1 | 8/2005 | Gralenski |
| 2005/0183670 A1 | 8/2005 | Grantham et al. |
| 2005/0186330 A1 | 8/2005 | Kim et al. |
| 2005/0213021 A1 | 9/2005 | Myoung |
| 2005/0217584 A1 | 10/2005 | Abiko et al. |
| 2005/0229848 A1 | 10/2005 | Shinriki et al. |
| 2005/0244580 A1 | 11/2005 | Cok et al. |
| 2005/0263074 A1 | 12/2005 | Masuda et al. |
| 2006/0011136 A1 | 1/2006 | Yamazaki et al. |
| 2006/0012771 A1 | 1/2006 | Jeong |
| 2006/0022590 A1 | 2/2006 | Aziz et al. |
| 2006/0040132 A1 | 2/2006 | Liao et al. |
| 2006/0045958 A1 | 3/2006 | Abiko et al. |
| 2006/0066231 A1 | 3/2006 | Nishikawa et al. |
| 2006/0090705 A1 | 5/2006 | Kim |
| 2006/0102078 A1 | 5/2006 | Fairbairn et al. |
| 2006/0110544 A1 | 5/2006 | Kim et al. |
| 2006/0113907 A1 | 6/2006 | Im et al. |
| 2006/0115585 A1 | 6/2006 | Bulovic et al. |
| 2006/0130766 A1 | 6/2006 | Kim et al. |
| 2006/0144325 A1 | 7/2006 | Jung et al. |
| 2006/0152641 A1 | 7/2006 | Brody |
| 2006/0164786 A1 | 7/2006 | Kobayashi et al. |
| 2006/0169211 A1 | 8/2006 | Kim et al. |
| 2006/0174829 A1 | 8/2006 | An et al. |
| 2006/0205101 A1 | 9/2006 | Lee et al. |
| 2006/0244696 A1 | 11/2006 | Jung et al. |
| 2006/0267294 A1 | 11/2006 | Busse et al. |
| 2006/0269671 A1 | 11/2006 | Kim et al. |
| 2006/0272572 A1 | 12/2006 | Uematsu et al. |
| 2006/0278522 A1 | 12/2006 | Kim et al. |
| 2006/0278945 A1 | 12/2006 | Sakurai |
| 2006/0280588 A1 | 12/2006 | Blonigan et al. |
| 2007/0009552 A1 | 1/2007 | Whitehead et al. |
| 2007/0009652 A1 | 1/2007 | Manz et al. |
| 2007/0017445 A1 | 1/2007 | Takehara et al. |
| 2007/0022955 A1 | 2/2007 | Bender et al. |
| 2007/0024185 A1 | 2/2007 | Kitamura et al. |
| 2007/0046185 A1 | 3/2007 | Kim |
| 2007/0046913 A1 | 3/2007 | Shibazaki |
| 2007/0054044 A1 | 3/2007 | Shimosaki et al. |
| 2007/0075955 A1 | 4/2007 | Jung et al. |
| 2007/0077358 A1 | 4/2007 | Jeong et al. |
| 2007/0148337 A1 | 6/2007 | Nichols et al. |
| 2007/0148348 A1 | 6/2007 | Huh et al. |
| 2007/0157879 A1 | 7/2007 | Yotsuya |
| 2007/0158471 A1 | 7/2007 | Park et al. |
| 2007/0163497 A1 | 7/2007 | Grace et al. |
| 2007/0178708 A1 | 8/2007 | Ukigaya |

(56) References Cited

U.S. PATENT DOCUMENTS

| | | |
|---|---|---|
| 2007/0190235 A1 | 8/2007 | Yamazaki et al. |
| 2007/0195844 A1 | 8/2007 | Ma et al. |
| 2007/0231460 A1 | 10/2007 | Ukigaya |
| 2007/0275497 A1 | 11/2007 | Kwack et al. |
| 2007/0297887 A1 | 12/2007 | Tanaka |
| 2008/0018236 A1 | 1/2008 | Arai et al. |
| 2008/0038935 A1 | 2/2008 | Baude et al. |
| 2008/0057183 A1 | 3/2008 | Spindler et al. |
| 2008/0100204 A1 | 5/2008 | Kim |
| 2008/0115729 A1 | 5/2008 | Oda et al. |
| 2008/0118743 A1 | 5/2008 | Lee et al. |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0216741 A1 | 9/2008 | Ling et al. |
| 2008/0238294 A1 | 10/2008 | Xu et al. |
| 2008/0251785 A1 | 10/2008 | Noh et al. |
| 2008/0286461 A1 | 11/2008 | Noguchi et al. |
| 2008/0298947 A1 | 12/2008 | Yeo et al. |
| 2008/0309718 A1 | 12/2008 | Oya et al. |
| 2009/0001882 A1* | 1/2009 | Park et al. ............... 313/504 |
| 2009/0014412 A1* | 1/2009 | Nozawa et al. ............ 216/25 |
| 2009/0017192 A1 | 1/2009 | Matsuura |
| 2009/0124033 A1 | 5/2009 | Moriyama |
| 2009/0133629 A1 | 5/2009 | Kamikawa et al. |
| 2009/0153033 A1 | 6/2009 | Lee et al. |
| 2009/0165713 A1 | 7/2009 | Kim et al. |
| 2009/0169868 A1 | 7/2009 | Haglund, Jr. et al. |
| 2009/0170230 A1 | 7/2009 | Kidu et al. |
| 2009/0181163 A1 | 7/2009 | Uetake |
| 2009/0208754 A1 | 8/2009 | Chu et al. |
| 2009/0220691 A1 | 9/2009 | Kim |
| 2009/0229524 A1 | 9/2009 | Kim et al. |
| 2009/0232976 A1* | 9/2009 | Yoon et al. ............... 427/157 |
| 2009/0269881 A1* | 10/2009 | Furuta et al. ............. 438/104 |
| 2009/0277386 A1 | 11/2009 | Takagi et al. |
| 2009/0279173 A1 | 11/2009 | Chui et al. |
| 2009/0302750 A1* | 12/2009 | Jun et al. ............... 313/504 |
| 2009/0304906 A1 | 12/2009 | Suduo et al. |
| 2009/0304924 A1 | 12/2009 | Gadgil |
| 2009/0308317 A1 | 12/2009 | Sone et al. |
| 2009/0315456 A1 | 12/2009 | Furukawa et al. |
| 2010/0001301 A1 | 1/2010 | Karg et al. |
| 2010/0055810 A1 | 3/2010 | Sung et al. |
| 2010/0086672 A1 | 4/2010 | Von Drasek et al. |
| 2010/0089443 A1 | 4/2010 | Bloomstein et al. |
| 2010/0090594 A1* | 4/2010 | Choi et al. ............... 313/506 |
| 2010/0130020 A1 | 5/2010 | Kim et al. |
| 2010/0156279 A1 | 6/2010 | Tamura et al. |
| 2010/0165454 A1 | 7/2010 | Suetsugu et al. |
| 2010/0170439 A1 | 7/2010 | Negishi |
| 2010/0192856 A1 | 8/2010 | Sung et al. |
| 2010/0196607 A1 | 8/2010 | Carlson et al. |
| 2010/0255198 A1 | 10/2010 | Cleary et al. |
| 2010/0271602 A1 | 10/2010 | Hanazaki |
| 2010/0275842 A1 | 11/2010 | Park et al. |
| 2010/0297348 A1 | 11/2010 | Lee et al. |
| 2010/0297349 A1 | 11/2010 | Lee et al. |
| 2010/0310768 A1 | 12/2010 | Lee et al. |
| 2010/0328197 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0042659 A1 | 2/2011 | Kim et al. |
| 2011/0045617 A1 | 2/2011 | Kang et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0053300 A1 | 3/2011 | Ryu et al. |
| 2011/0068331 A1 | 3/2011 | Koh et al. |
| 2011/0123707 A1 | 5/2011 | Lee et al. |
| 2011/0165327 A1 | 7/2011 | Park et al. |
| 2011/0168986 A1 | 7/2011 | Lee et al. |
| 2011/0220019 A1 | 9/2011 | Lee et al. |
| 2011/0241438 A1 | 10/2011 | Kim et al. |
| 2011/0262625 A1 | 10/2011 | Park et al. |
| 2011/0266944 A1 | 11/2011 | Song et al. |
| 2012/0009328 A1 | 1/2012 | Ryu et al. |
| 2012/0009332 A1 | 1/2012 | Kim et al. |
| 2012/0009706 A1 | 1/2012 | Choi et al. |
| 2012/0028390 A1 | 2/2012 | Lee et al. |
| 2012/0068199 A1 | 3/2012 | Sung et al. |
| 2012/0068201 A1 | 3/2012 | Sung et al. |
| 2012/0070928 A1 | 3/2012 | Kim et al. |
| 2012/0083061 A1 | 4/2012 | Kang et al. |
| 2012/0097992 A1 | 4/2012 | Jeong |
| 2012/0100282 A1 | 4/2012 | Lee et al. |
| 2012/0103253 A1 | 5/2012 | Park et al. |
| 2012/0132137 A1 | 5/2012 | Oh et al. |
| 2012/0145077 A1 | 6/2012 | Chang et al. |
| 2012/0148743 A1 | 6/2012 | Bulovic et al. |
| 2012/0174865 A1 | 7/2012 | Choi et al. |
| 2012/0175605 A1 | 7/2012 | Shin et al. |
| 2012/0183676 A1 | 7/2012 | Sonoda et al. |
| 2012/0214263 A1 | 8/2012 | Yamazaki et al. |
| 2012/0299016 A1 | 11/2012 | Choi |
| 2012/0299023 A1 | 11/2012 | Lee et al. |
| 2012/0299024 A1 | 11/2012 | Lee et al. |
| 2012/0301614 A1 | 11/2012 | Choi et al. |
| 2012/0301986 A1 | 11/2012 | Choi et al. |
| 2012/0313251 A1 | 12/2012 | Kato |
| 2013/0001528 A1 | 1/2013 | Chang et al. |
| 2013/0008379 A1 | 1/2013 | Chang et al. |
| 2013/0032829 A1 | 2/2013 | Sung et al. |
| 2013/0157016 A1 | 6/2013 | Kim |
| 2013/0217164 A1 | 8/2013 | Kang et al. |
| 2013/0291796 A1 | 11/2013 | Inoue et al. |
| 2013/0298829 A1 | 11/2013 | Jo et al. |
| 2013/0341598 A1 | 12/2013 | Chang et al. |
| 2014/0010957 A1 | 1/2014 | Inoue et al. |
| 2014/0014917 A1 | 1/2014 | Lee et al. |
| 2014/0014918 A1 | 1/2014 | Han |
| 2014/0014920 A1 | 1/2014 | Lee |
| 2014/0014921 A1 | 1/2014 | Choi |
| 2014/0014924 A1 | 1/2014 | Oh et al. |
| 2014/0014929 A1 | 1/2014 | Lee et al. |

FOREIGN PATENT DOCUMENTS

| | | |
|---|---|---|
| CN | 1500904 A | 6/2004 |
| CN | 1556872 A | 12/2004 |
| CN | 1607868 A | 4/2005 |
| CN | 1682569 A | 10/2005 |
| CN | 1704501 A | 12/2005 |
| CN | 1814854 A | 8/2006 |
| CN | 1841696 A | 10/2006 |
| EP | 1413644 A2 | 4/2004 |
| EP | 1418250 A2 | 5/2004 |
| EP | 1518940 A1 | 3/2005 |
| EP | 2354270 A1 | 8/2011 |
| JP | 57-194252 A2 | 11/1982 |
| JP | 2-247372 | 10/1990 |
| JP | 4-272170 | 9/1992 |
| JP | 5-22405 U1 | 3/1993 |
| JP | 5-98425 A2 | 4/1993 |
| JP | 5-230628 A2 | 9/1993 |
| JP | 8-27568 A2 | 1/1996 |
| JP | 9-95776 A2 | 4/1997 |
| JP | 10-50478 | 2/1998 |
| JP | 10-120171 | 5/1998 |
| JP | 10-270535 | 10/1998 |
| JP | 11-144865 | 5/1999 |
| JP | 2000-68054 A2 | 3/2000 |
| JP | 2000-282219 | 10/2000 |
| JP | 2000-323277 | 11/2000 |
| JP | 2001-28325 A2 | 1/2001 |
| JP | 2001-52862 A2 | 2/2001 |
| JP | 2001-093667 | 4/2001 |
| JP | 2002-75638 A2 | 3/2002 |
| JP | 2002-175878 | 6/2002 |
| JP | 2002-348659 A2 | 12/2002 |

(56) References Cited

FOREIGN PATENT DOCUMENTS

| | | |
|---|---|---|
| JP | 2003-3250 A2 | 1/2003 |
| JP | 2003-77662 A2 | 3/2003 |
| JP | 2003-157973 | 5/2003 |
| JP | 2003-197531 A2 | 7/2003 |
| JP | 2003-297562 | 10/2003 |
| JP | 2003-321767 A2 | 11/2003 |
| JP | 2003-347394 A2 | 12/2003 |
| JP | 2004-035964 A2 | 2/2004 |
| JP | 2004-043898 A2 | 2/2004 |
| JP | 2004-76150 A2 | 3/2004 |
| JP | 2004-91858 A2 | 3/2004 |
| JP | 2004-103269 | 4/2004 |
| JP | 2004-103341 | 4/2004 |
| JP | 2004-107764 A2 | 4/2004 |
| JP | 2004-137583 A2 | 5/2004 |
| JP | 2004-143521 A2 | 5/2004 |
| JP | 2004-169169 A2 | 6/2004 |
| JP | 2004-199919 | 7/2004 |
| JP | 2004-225058 | 8/2004 |
| JP | 2004-342455 A2 | 12/2004 |
| JP | 2004-349101 | 12/2004 |
| JP | 2004-355975 | 12/2004 |
| JP | 2005-44592 A2 | 2/2005 |
| JP | 2005-101505 | 4/2005 |
| JP | 2005-122980 A2 | 5/2005 |
| JP | 2005-165015 A2 | 6/2005 |
| JP | 2005-174843 A2 | 6/2005 |
| JP | 2005-206939 A2 | 8/2005 |
| JP | 2005-213616 A2 | 8/2005 |
| JP | 2005-235568 | 9/2005 |
| JP | 2005-293968 | 10/2005 |
| JP | 2005-296737 | 10/2005 |
| JP | 2006-28583 A2 | 2/2006 |
| JP | 2006-172930 A2 | 6/2006 |
| JP | 2006-176809 A2 | 7/2006 |
| JP | 2006-210038 A2 | 8/2006 |
| JP | 2006-219760 | 8/2006 |
| JP | 2006-275433 A2 | 10/2006 |
| JP | 2006-292955 A2 | 10/2006 |
| JP | 2006-307247 A2 | 11/2006 |
| JP | 2007-47293 | 2/2007 |
| JP | 2007-66862 | 3/2007 |
| JP | 2007-146219 | 6/2007 |
| JP | 2007-157886 | 6/2007 |
| JP | 2007-186740 A2 | 7/2007 |
| JP | 2007-242436 | 9/2007 |
| JP | 2007-291506 A2 | 11/2007 |
| JP | 2008-19477 A2 | 1/2008 |
| JP | 2008-108628 A2 | 5/2008 |
| JP | 2008-121098 | 5/2008 |
| JP | 2008-521165 A2 | 6/2008 |
| JP | 2008-196003 | 8/2008 |
| JP | 2008-248301 A2 | 10/2008 |
| JP | 2008-300056 | 12/2008 |
| JP | 2009-019243 | 1/2009 |
| JP | 2009-24208 A2 | 2/2009 |
| JP | 2009-049223 | 3/2009 |
| JP | 2009-81165 A2 | 4/2009 |
| JP | 2009-087910 | 4/2009 |
| JP | 2009-117231 A2 | 5/2009 |
| JP | 2010-159167 A2 | 7/2010 |
| JP | 2010-261081 A2 | 11/2010 |
| JP | 2011-47035 | 3/2011 |
| JP | 2011-146377 | 7/2011 |
| JP | 2012-92448 | 5/2012 |
| JP | 2012-211352 | 11/2012 |
| KR | 1997-0008709 A | 2/1997 |
| KR | 10-0257219 B1 | 2/2000 |
| KR | 10-2000-0019254 A | 4/2000 |
| KR | 10-2000-0023929 A | 5/2000 |
| KR | 2001-0024652 A | 3/2001 |
| KR | 2001-0030175 A | 4/2001 |
| KR | 10-2001-0039298 A | 5/2001 |
| KR | 10-2001-0059939 | 7/2001 |
| KR | 10-2001-0092914 A | 10/2001 |
| KR | 2001-0093666 A | 10/2001 |
| KR | 20-0257218 Y1 | 12/2001 |
| KR | 10-2002-0000201 | 1/2002 |
| KR | 2002-0001555 A | 1/2002 |
| KR | 10-2002-0050922 | 6/2002 |
| KR | 2002-0088662 A | 11/2002 |
| KR | 10-2002-0090934 | 12/2002 |
| KR | 10-2002-0091457 A | 12/2002 |
| KR | 2003-0001745 A | 1/2003 |
| KR | 2003-0034730 A | 5/2003 |
| KR | 10-2003-0043012 A | 6/2003 |
| KR | 2003-0046090 A | 6/2003 |
| KR | 2003-0069684 A | 8/2003 |
| KR | 10-0405080 B1 | 11/2003 |
| KR | 10-0406059 B1 | 11/2003 |
| KR | 2003-0091947 | 12/2003 |
| KR | 2003-0093959 | 12/2003 |
| KR | 2003-0094033 A | 12/2003 |
| KR | 10-2004-0014258 A | 2/2004 |
| KR | 20-0342433 Y1 | 2/2004 |
| KR | 10-2004-0034537 A | 4/2004 |
| KR | 10-2004-0039910 A | 5/2004 |
| KR | 10-0430336 B1 | 5/2004 |
| KR | 10-2004-0050045 A | 6/2004 |
| KR | 10-2004-0069281 A | 8/2004 |
| KR | 10-2004-0084747 | 10/2004 |
| KR | 10-2004-0087142 A | 10/2004 |
| KR | 10-2004-0110718 A | 12/2004 |
| KR | 10-0463212 B1 | 12/2004 |
| KR | 10-2005-0018234 A | 2/2005 |
| KR | 10-2005-0024324 A | 3/2005 |
| KR | 10-2005-0028943 | 3/2005 |
| KR | 10-2005-0039140 A | 4/2005 |
| KR | 10-0483487 B1 | 4/2005 |
| KR | 10-2005-0062853 A | 6/2005 |
| KR | 10-2005/0082644 A | 8/2005 |
| KR | 10-0520159 B1 | 10/2005 |
| KR | 10-0532657 B1 | 12/2005 |
| KR | 10-2006-0008602 A | 1/2006 |
| KR | 10-2006-0018745 A | 3/2006 |
| KR | 10-2006-0020050 A | 3/2006 |
| KR | 10-2006-0045225 A | 5/2006 |
| KR | 10-2006-0049050 A | 5/2006 |
| KR | 10-2006-0051746 A | 5/2006 |
| KR | 10-2006-0053926 A | 5/2006 |
| KR | 10-2006-0056706 A | 5/2006 |
| KR | 10-2006-0058459 A | 5/2006 |
| KR | 10-2009-0052828 A | 5/2006 |
| KR | 10-2006-0059068 A | 6/2006 |
| KR | 10-2006-0059323 A | 6/2006 |
| KR | 10-2006-0060994 | 6/2006 |
| KR | 10-2006-0065978 A | 6/2006 |
| KR | 10-2006-0073367 A | 6/2006 |
| KR | 10-2006-0077887 A | 7/2006 |
| KR | 10-2006-0080475 A | 7/2006 |
| KR | 10-2006-0080481 A | 7/2006 |
| KR | 10-2006-0080482 A | 7/2006 |
| KR | 10-2006-0081943 A | 7/2006 |
| KR | 10-2006-0083510 A | 7/2006 |
| KR | 10-2006-0092387 A | 8/2006 |
| KR | 10-2006-0098755 A | 9/2006 |
| KR | 10-2006-0104288 A | 10/2006 |
| KR | 10-2006-0104675 A | 10/2006 |
| KR | 10-2006-0104677 A | 10/2006 |
| KR | 10-2006-0109561 A | 10/2006 |
| KR | 10-2006-0109627 A | 10/2006 |
| KR | 10-0635903 B1 | 10/2006 |
| KR | 10-2006-0114462 A | 11/2006 |
| KR | 10-2006-0114477 A | 11/2006 |
| KR | 10-2006-0114573 A | 11/2006 |
| KR | 10-0645719 B1 | 11/2006 |
| KR | 10-0646160 B1 | 11/2006 |
| KR | 10-2006-0123944 A | 12/2006 |
| KR | 10-0687007 B1 | 2/2007 |
| KR | 10-0696547 B1 | 3/2007 |
| KR | 10-0696550 B1 | 3/2007 |
| KR | 10-0697663 B1 | 3/2007 |
| KR | 10-0698033 B1 | 3/2007 |
| KR | 10-0700466 B1 | 3/2007 |

(56) References Cited

FOREIGN PATENT DOCUMENTS

| | | |
|---|---|---|
| KR | 10-2007-0035796 A | 4/2007 |
| KR | 10-2007-0037848 A | 4/2007 |
| KR | 10-0711885 B1 | 4/2007 |
| KR | 10-2007-0050793 A | 5/2007 |
| KR | 10-0723627 B1 | 5/2007 |
| KR | 10-2007-0056190 A | 6/2007 |
| KR | 10-0726132 B1 | 6/2007 |
| KR | 10-0736218 B1 | 7/2007 |
| KR | 10-0741142 B1 | 7/2007 |
| KR | 10-2007-0078713 A | 8/2007 |
| KR | 10-2007-0080635 A | 8/2007 |
| KR | 10-2007-0091437 A | 9/2007 |
| KR | 10-2006-0028115 | 10/2007 |
| KR | 10-2007-0097218 | 10/2007 |
| KR | 10-2007-0098122 A | 10/2007 |
| KR | 10-2007-0101842 A | 10/2007 |
| KR | 10-2007-0105595 A | 10/2007 |
| KR | 10-0768212 B1 | 10/2007 |
| KR | 10-0770653 B1 | 10/2007 |
| KR | 10-2007-0112668 A | 11/2007 |
| KR | 10-2007-0114094 A | 11/2007 |
| KR | 10-0739309 B1 | 12/2007 |
| KR | 10-0787457 B1 | 12/2007 |
| KR | 10-2008-0001184 A | 1/2008 |
| KR | 10-2008-0003720 A | 1/2008 |
| KR | 10-2008-0007896 A | 1/2008 |
| KR | 10-2008-0009285 A | 1/2008 |
| KR | 10-0797787 B1 | 1/2008 |
| KR | 10-0800125 B1 | 1/2008 |
| KR | 10-0815265 B1 | 3/2008 |
| KR | 10-2008-0036983 A | 4/2008 |
| KR | 10-0823508 B1 | 4/2008 |
| KR | 10-0823511 B1 | 4/2008 |
| KR | 10-2008-0044239 A | 5/2008 |
| KR | 10-2008-0044775 A | 5/2008 |
| KR | 10-2008-0046761 A | 5/2008 |
| KR | 10-0827760 B1 | 5/2008 |
| KR | 10-2008-0048653 | 6/2008 |
| KR | 10-2008-0055124 A | 6/2008 |
| KR | 10-2008-0057159 A | 6/2008 |
| KR | 10-0839380 B1 | 6/2008 |
| KR | 10-2008-0060400 A | 7/2008 |
| KR | 10-2008-0061132 A | 7/2008 |
| KR | 10-2008-0061666 A | 7/2008 |
| KR | 10-2008-0061774 A | 7/2008 |
| KR | 10-2008-0062212 A | 7/2008 |
| KR | 10-0899279 B1 | 7/2008 |
| KR | 10-2008-0076574 A | 8/2008 |
| KR | 10-2008-0088737 A | 10/2008 |
| KR | 10-2008-0104479 A | 12/2008 |
| KR | 10-2008-0104695 A | 12/2008 |
| KR | 10-2008-0109559 A | 12/2008 |
| KR | 10-2009-0017910 A | 2/2009 |
| KR | 10-0889872 B1 | 3/2009 |
| KR | 10-2009-0038733 A | 4/2009 |
| KR | 10-2009-0040618 A | 4/2009 |
| KR | 10-2009-0047953 A | 5/2009 |
| KR | 10-2009-0052155 A | 5/2009 |
| KR | 10-2009-0053417 A | 5/2009 |
| KR | 10-2009-0066996 A | 6/2009 |
| KR | 10-2009-0079765 A | 7/2009 |
| KR | 10-2009-0081717 A | 7/2009 |
| KR | 10-0908232 B1 | 7/2009 |
| KR | 10-2009-0093161 A | 9/2009 |
| KR | 10-2009-0094911 A | 9/2009 |
| KR | 10-2009-0097453 A | 9/2009 |
| KR | 10-2009-0107702 | 10/2009 |
| KR | 10-0922763 B1 | 10/2009 |
| KR | 10-2009-0075887 A | 11/2009 |
| KR | 10-2010-0000128 A | 1/2010 |
| KR | 10-2010-0000129 A | 1/2010 |
| KR | 10-2010-0002381 A | 1/2010 |
| KR | 10-2010-0026655 A | 3/2010 |
| KR | 10-2010-0038088 A | 4/2010 |
| KR | 10-2010-0044606 A | 4/2010 |
| KR | 10-0961110 B1 | 6/2010 |
| KR | 10-2010-0090070 A | 8/2010 |
| KR | 10-2010-0099806 A | 9/2010 |
| KR | 10-2010-0119368 A | 11/2010 |
| KR | 10-2010-0126125 A | 12/2010 |
| KR | 10-2010-0128589 A | 12/2010 |
| KR | 10-2010-0130786 A | 12/2010 |
| KR | 10-2010-0133678 A | 12/2010 |
| KR | 10-2010-0138139 A | 12/2010 |
| KR | 10-1017654 B1 | 2/2011 |
| KR | 10-2011-0021090 A | 3/2011 |
| KR | 10-2011-0022512 A | 3/2011 |
| KR | 10-2011-0032589 A | 3/2011 |
| KR | 10-2011-0082418 A | 7/2011 |
| KR | 10-2011-0101767 A | 9/2011 |
| KR | 10-2011-0110525 A | 10/2011 |
| KR | 10-2011-0120213 A | 11/2011 |
| KR | 10-2011-0138787 A | 12/2011 |
| KR | 10-2012-0006322 A | 1/2012 |
| KR | 10-2012-0006324 A | 1/2012 |
| KR | 10-2012-0012300 | 2/2012 |
| KR | 10-2010-0047796 | 5/2012 |
| KR | 10-2012-0042155 A | 5/2012 |
| KR | 10-2012-0065789 A | 6/2012 |
| KR | 10-2012-0080855 A | 7/2012 |
| KR | 10-2012-0081811 A | 7/2012 |
| KR | 10-1193186 B1 | 10/2012 |
| KR | 10-2012-0131545 A | 12/2012 |
| KR | 10-2013-0007308 A | 1/2013 |
| WO | 9925894 A1 | 5/1999 |
| WO | 03043067 A1 | 5/2003 |
| WO | WO2004016406 A1 | 2/2004 |
| WO | 2008004792 A1 | 1/2008 |

OTHER PUBLICATIONS

Machine translation of JP 2007-242436, Published Sep. 20, 2007, 26 pgs.
KIPO Registration Determination Certificate dated Nov. 30, 2011, for Korean Patent application 10-2009-0056530.
European Search Report dated May 13, 2011 for European Application No. 11250019.4 (6 pages).
European Search Report dated May 20, 2011 for European Application No. 10251404.9 (12 pages).
European Search Report dated May 27, 2011 for European Application No. 10251514.5 (11 pages).
European Search Report dated Sep. 6, 2010 for European Application No. 10250962.7 (5 pages).
Japanese Patent Office Action dated Jan. 22, 2013 for Japanese Application No. 2010-116470, (3 pages).
Japanese Patent Office Action dated Jan. 8, 2013 for Japanese Application No. 2011-000180 (3 pages).
Japanese Patent Office Action dated Mar. 19, 2013 for Japanese Application No. 2011-097909, (3 pages).
JP Office action dated Aug. 21, 2012, issued to JP Application No. 2010-145075 (5 pages).
JP Office action dated Sep. 4, 2012, issued to JP Application No. 2010-152846 (4 pages).
JPO Office action dated Apr. 1, 2014, for Japanese Patent application 2010-286245 (4 pages).
JPO Office action dated Feb. 25, 2014, for corresponding Japanese Patent application 2013-128405 (3 pages).
JPO Office action dated Jan. 28, 2014, for corresponding Japanese Patent application 2011-097909 (4 pages).
KIPO Notice of Allowance dated Apr. 26, 2012 for Korean Application No. 10-2010-0066991 (5 pages).
KIPO Notice of Allowance dated Apr. 30, 2012, issued to KR 10-2010-0066992 (5 pages).
KIPO Notice of Allowance dated Aug. 24, 2012, issued to KR 10-2010-0066993 (5 pages).
KIPO Notice of Allowance dated Jul. 20, 2012, issued to KR 10-2010-0003545 (5 pages).
KIPO Notice of Allowance dated Oct. 27, 2011 for Korean Application No. 10-2010-0002381 (5 pages).
KIPO Notice of Allowance dated Oct. 31, 2011, for Korean Patent application 10-2010-0014273, (5 pages).

(56) References Cited

OTHER PUBLICATIONS

KIPO Notice of Allowance dated Sep. 1, 2012, for Korean Patent application 10-2010-0013847 (5 pages).
KIPO Notice of Allowance dated Sep. 1, 2012, issued to KR 10-2010-0009160 (5 pages).
KIPO Notice of Allowance dated Sep. 1, 2012, issued to KR 10-2010-0013848 (5 pages).
KIPO Notice of Allowance dated Sep. 23, 2011 for Korean Application No. 10-2009-0055473 (5 pages).
KIPO Notice of Allowance dated Sep. 28, 2011 for Korean Application No. 10-2009-0045201 (5 pages).
KIPO Notice of Allowance dated Sep. 28, 2011 for Korean Application No. 10-2009-0052359 (5 pages).
KIPO Notice of Allowance, dated Nov. 25, 2011, issued to KR 10-2010-0014277 (5 pages).
KIPO Notice of Allowance, dated Sep. 1, 2012, issued to KR 10-2010-0014276 (5 pages).
KIPO Notice of Allowance, dated Sep. 28, 2011, issued to KR 10-2009-0052357 (5 pages).
KIPO Office action dated Apr. 2, 2012, issued to KR 10-2010-0066993 (4 pages).
KIPO Office action dated Apr. 4, 2012, issued in KR Application No. 10-2009-0112796 (5 pages).
KIPO Office Action dated Apr. 9, 2012 for Korean Application No. 10-2010-0031556 (4 pages).
KIPO Office action dated Aug. 1, 2011, issued to KR 10-2009-0074001 (3 pages).
KIPO Office Action dated Aug. 28, 2012, issued to KR 10-2010-0014274 (5 pages).
KIPO Office action dated Feb. 1, 2012, for Korean Patent application 10-2010-0013847 (5 pages).
KIPO Office action dated Feb. 1, 2012, issued to KR 10-2010-0011196 (4 pages).
KIPO Office action dated Feb. 1, 2012, issued to KR 10-2010-0013848 (4 pages).
KIPO Office action dated Feb. 1, 2012, issued to KR 10-2010-0014272 (4 pages).
KIPO Office Action dated Feb. 6, 2012 for Korean Application No. 10-2010-0011480 (8 pages).
KIPO Office Action dated Feb. 6, 2012 for Korean Application No. 10-2010-0011481 (7 pages).
KIPO Office Action dated Feb. 6, 2012, issued to KR 10-2010-0014274 (9 pages).
KIPO Office Action dated Feb. 6, 2012, issued to KR 10-2010-0021835 (4 pages).
KIPO Office action dated Jan. 13, 2012, issued to KR 10-2009-0056529 (5 pages).
KIPO Office action dated Jan. 6, 2012, issued to KR Application No. 10-2010-0000897 (4 pages).
KIPO Office action dated Jul. 1, 2011, issued to KR Application No. 10-2009-0072111 (4 pages).
KIPO Office action dated Jun. 1, 2011, issued to KR Application No. 10-2009-0050528 (4 pages).
KIPO Office action dated Mar. 21, 2012, issued to KR Application No. 10-2010-0065465 (5 pages).
KIPO Office action dated Sep. 1, 2012, issued to KR 10-2010-0010136 (5 pages).
KIPO Registration Determination Certificate dated Jul. 2, 2012, for Korean Application No. 10-2010-0011480 (5 pages).
KIPO Registration Determination Certificate dated Jul. 2, 2012, for Korean Application No. 10-2010-0011481 (5 pages).
KIPO Registration Determination Certificate, dated Jul. 20, 2012, issued to KR Application No. 10-2010-0000897 (5 pages).
Korean Registration Certificate dated Sep. 28, 2011 for Korean Application No. 10-2009-0045200 (5 pages).
SIPO Certificate of Patent dated Aug. 14, 2013, for Chinese application 20100266406.6, (36 pages).
SIPO Certificate of Patent dated Jul. 31, 2013, corresponding to Chinese Patent application 201110029291.3, (31 pages).
SIPO Office action dated Dec. 17, 2013, for Chinese Patent application 201010216896.9 (6 pages).
SIPO Office action dated Feb. 14, 2014, for corresponding Chinese Patent application 201010189614.0 (16 pages).
SIPO Office action dated Mar. 11, 2014, for corresponding Chinese Patent application 201010189581.X (9 pages).
SIPO Office Action dated May 29, 2013, for Chinese Application No. 201010189614.0 (12 pages).
SIPO Office Action dated Nov. 28, 2012 for Chinese Application No. 201110029291.3 (11 pages).
SIPO Office Action dated Oct. 9, 2012 for Chinese Application No. 201010266406.6 (6 pages).
Taiwanese Office action dated Apr. 14, 2014, for Taiwanese Patent application 100114360 (20 pages).
Taiwanese Office action dated Dec. 20, 2013, for Taiwanese Patent application 099116077 (8 pages).
U.S. Interview Summary dated Mar. 11, 2014 for U.S. Appl. No. 12/813,786 (4 pages).
U.S. Notice of Allowance dated Feb. 28, 2014, issued to U.S. Appl. No. 13/279,077 (12 pages).
U.S. Notice of Allowance dated May 9, 2014 for U.S. Appl. No. 13/194,759 (27 pages).
U.S. Office action dated Apr. 1, 2013, issued to U.S. Appl. No. 12/784,774 (44 pages).
U.S. Office action dated Apr. 18, 2014, issued to U.S. Appl. No. 12/814,816 (9 pages).
U.S. Office action dated Apr. 29, 2013, issued to U.S. Appl. No. 12/820,355 (31 pages).
U.S. Office action dated Aug. 13, 2013, issued to U.S. Appl. No. 13/194,759, (28 pages).
U.S. Office Action dated Aug. 2, 2013 for U.S. Appl. No. 12/868,099 (32 pages).
U.S. Office action dated Aug. 21, 2013 issued in cross-reference U.S. Appl. No. 12/820,355 (14 pages).
U.S. Office action dated Aug. 7, 2013, issued to U.S. Appl. No. 13/015,357, (30 pages).
U.S. Office action dated Aug. 8, 2013, for cross reference U.S. Appl. No. 13/093,707, (7 pages).
U.S. Office Action dated Dec. 13, 2011 for U.S. Appl. No. 12/849,193 (30 pages).
U.S. Office action dated Dec. 16, 2013 for U.S. Appl. No. 14/054,536 (35 pages).
U.S. Office action dated Dec. 17,2012, issued to U.S. Appl. No. 12/873,556 (37 pages).
U.S. Office action dated Dec. 26, 2012, issued to U.S. Appl. No. 12/815,673 (21 pages).
U.S. Office action dated Feb. 11, 2014, for cross reference U.S. Appl. No. 13/178,472 (8 pages).
U.S. Office action dated Feb. 26, 2013, issued to U.S. Appl. No. 12/794,093 (31 pages).
U.S. Office action dated Feb. 6, 2014, for U.S. Appl. No. 12/984,231 (16 pages).
U.S. Office action dated Jan. 25, 2013, issued to U.S. Appl. No. 13/015,357 (21 pages).
U.S. Office action dated Jul. 11, 2013 for U.S. Appl. No. 13/461,669 (27 pages).
U.S. Office action dated Jul. 17, 2013, issued to U.S. Appl. No. 12/984,231, (18 pages).
U.S. Office action dated Jul. 24, 2013, issued to U.S. Appl. No. 12/784,804, (52 pages).
U.S. Office action dated Jul. 3, 2013 in U.S. Appl. No. 12/873,689 (48 pages).
U.S. Office action dated Jul. 5, 2013, issued to U.S. Appl. No. 12/873,556, (17 pages).
U.S. Office Action dated Jun. 11, 2013 for U.S. Appl. No. 12/979,656 (50 pages).
U.S. Office action dated Jun. 11, 2013, issued to U.S. Appl. No. 12/862,125 (37 pages).
U.S. Office action dated Jun. 17, 2013, for cross reference U.S. Appl. No. 13/180,454, (23 pages).
U.S. Office Action dated Jun. 21, 2011 for U.S. Appl. No. 12/862,153 (21 pages).

(56) References Cited

OTHER PUBLICATIONS

U.S. Office action dated Jun. 26, 2013, issued to U.S. Appl. No. 12/794,093 (20 pages).
U.S. Office action dated Mar. 15, 2013, issued to U.S. Appl. No. 12/813,786 (33 pages).
U.S. Office action dated Mar. 17, 2014, for U.S. Appl. No. 12/950,361 (48 pages).
U.S. Office action dated Mar. 18, 2013, issued to U.S. Appl. No. 12/984,231 (29 pages).
U.S. Office action dated Mar. 19, 2013, issued to U.S. Appl. No. 13/194,759 (36 pages).
U.S. Office action dated Mar. 22, 2013, issued to U.S. Appl. No. 12/987,569 (12 pages).
U.S. Office Action dated Mar. 23, 2012 for U.S. Appl. No. 12/849,193 (17 pages).
U.S. Office action dated May 22, 2013, for cross reference U.S. Appl. No. 13/219,427, (26 pages).
U.S. Office action dated May 24, 2013, issued to U.S. Appl. No. 12/849,092 (31 pages).
U.S. Office Action dated May 7, 2013, issued in U.S. Appl. No. 12/820,270 (37 pages).
U.S. Office action dated Nov. 20, 2013, for cross reference U.S. Appl. No. 12/868,099, (14 pages).
U.S. Office action dated Nov. 22, 2013, issued to U.S. Appl. No. 13/198,591, (28 pages).
U.S. Office action dated Nov. 25, 2013, issued to U.S. Appl. No. 13/176,701, (49 pages).
U.S. Office action dated Nov. 4, 2013, for U.S. Appl. No. 13/219,427, (26 pages).
U.S. Office action dated Oct. 1, 2013, issued to U.S. Appl. No. 12/849,092, (13 pages).
U.S. Office action dated Oct. 11, 2013, issued to U.S. Appl. No. 12/907,396, (44 pages).
U.S. Office action dated Oct. 21, 2013, issued to U.S. Appl. No. 12/987,569, (14 pages).
U.S. Office action dated Oct. 7, 2013, issued to U.S. Appl. No. 13/279,077, (29 pages).
U.S. Office action dated Sep. 20, 2013, issued to U.S. Appl. No. 13/014,225, (33 pages).
U.S. Office action dated Sep. 25, 2013, for U.S. Appl. No. 13/031,756, (34 pages).
U.S. Office action dated Sep. 27, 2013, issued to U.S. Appl. No. 12/814,816 (19 pages).
U.S. Patent Office Action dated May 16, 2013, issued to U.S. Appl. No. 13/235,337 (28 pages).
US Notice of Allowance, dated Mar. 18, 2013, issued to U.S. Appl. No. 12/795,001 (29 pages).
US Office action dated Dec. 20, 2012, issued to U.S. Appl. No. 12/984,289 (20 pages).
US Office action dated Sep. 12, 2012, in U.S. Appl. No. 12/515,673 (26 pages).

* cited by examiner

METHOD OF MANUFACTURING ORGANIC LIGHT EMITTING DISPLAY APPARATUS, AND ORGANIC LIGHT EMITTING DISPLAY APPARATUS MANUFACTURED BY USING THE METHOD

CROSS-REFERENCE TO RELATED APPLICATION

This application claims priority to and the benefit of Korean Patent Application No. 10-2010-0103679, filed on Oct. 22, 2010, in the Korean Intellectual Property Office, the disclosure of which is incorporated herein in its entirety by reference.

BACKGROUND

1. Field

The present invention relates to a method of manufacturing an organic light-emitting display device and an organic light-emitting display device manufactured by using the method.

2. Description of Related Art

Organic light-emitting display devices have a larger viewing angle, better contrast characteristics, and a faster response speed than other display devices, and thus have drawn attention as next-generation display devices.

An organic light-emitting display device includes intermediate layers, including an emission layer located between a first electrode and a second electrode that are arranged opposite to each other. The electrodes and the intermediate layers may be formed via various methods, one of which is a deposition method. When an organic light-emitting display device is manufactured by using a typical deposition method, a fine metal mask (FMM) having the same pattern as an organic layer or the like to be formed on a substrate is positioned to closely contact a surface of the substrate on which the organic layer or the like is to be formed, and an organic layer material is deposited over the FMM in order to form the organic layer having the desired pattern.

However, the deposition method using such FMM is not suitable for manufacturing larger devices using a mother glass having a size of 5 G or greater. For instance, when such a large mask is used, the mask may bend due to its own weight, thereby distorting a pattern. This is not conducive for the recent trend towards high-definition patterns.

SUMMARY

Exemplary embodiments according to the present invention provide a method of manufacturing an organic light-emitting display device that is suitable for manufacturing large-sized display devices on a mass scale and that can be used for high-definition patterning, and an organic light-emitting display device manufactured by using the method.

According to an aspect of an embodiment according to the present invention, there is provided a method of manufacturing an organic light emitting display device, the method including consecutively forming organic layers on a substrate on which a plurality of panels are arranged parallel to each other; forming a second electrode on the organic layers, for each of the panels; forming a passivation layer on the second electrode on each of the panels to cover the second electrode; and removing a part of the organic layers that exists between the passivation layer on the second electrode of one of the panels and the passivation layer on the second electrode of an adjacent one of the panels.

The removing of the part of the organic layers may include removing the part of the organic layers that exists in a region where the passivation layer is not formed, by using the passivation layer as a mask.

The removing of the part of the organic layers may include removing the part of the organic layers by performing chemical etching in which plasma including oxygen $O_2$ is used.

Each panel may include a circuit region and a pixel region, and the second electrode and the passivation layer may be formed in the pixel region.

The removing of the part of the organic layers may include removing an organic material deposited in the circuit region.

The passivation layer may include Alq3(Tris(8-hydroxyquinolinato)aluminum).

In the forming of the passivation layer, the passivation layer may be larger than the second electrode so as to completely cover the second electrode.

During the consecutive forming of the organic layers, an organic layer deposition apparatus may be spaced from the substrate, and deposition may be performed on the substrate while the substrate and the organic layer deposition apparatus are moving relative to each other. The organic layer deposition apparatus may include a deposition source for emitting a deposition material, a deposition source nozzle unit located at a side of the deposition source and including a plurality of deposition source nozzles arranged in a first direction, a patterning slit sheet located opposite to the deposition source nozzle unit and including a plurality of patterning slits arranged in the first direction, and a barrier plate assembly including a plurality of barrier plates that are arranged in the first direction between the deposition source nozzle unit and the patterning slit sheet and that partition the space between the deposition source nozzle unit and the patterning slit sheet into a plurality of sub-deposition spaces.

Each of the plurality of barrier plates may extend in a second direction that is substantially perpendicular to the first direction, in order to partition the space between the deposition source nozzle unit and the patterning slit sheet into the plurality of sub-deposition spaces.

The barrier plate assembly may include a first barrier plate assembly including a plurality of first barrier plates, and a second barrier plate assembly including a plurality of second barrier plates.

Each of the first barrier plates and each of the second barrier plates may extend in a second direction that is substantially perpendicular to the first direction, in order to partition the space between the deposition source nozzle unit and the patterning slit sheet into the plurality of sub-deposition spaces.

The patterning slit sheet of the organic layer deposition apparatus may be smaller than the substrate.

An organic layer deposition apparatus may be spaced from the substrate, and deposition may be performed on the substrate while the substrate and the organic layer deposition apparatus are moving relative to each other, wherein the organic layer deposition apparatus may include a deposition source for emitting a deposition material, a deposition source nozzle unit located at a side of the deposition source and including a plurality of deposition source nozzles arranged in a first direction, and a patterning slit sheet located opposite to the deposition source nozzle unit and including a plurality of patterning slits arranged in a second direction that is substantially perpendicular to the first direction.

The plurality of deposition source nozzles may tilt at an angle.

The plurality of deposition source nozzles may include deposition source nozzles arranged in two rows formed in the first direction, and the deposition source nozzles in the two rows may be tilted to face each other.

The plurality of deposition source nozzles may include deposition source nozzles arranged in two rows formed in the first direction. The deposition source nozzles of one row located at a second side of the patterning slit sheet may be arranged to face a first side of the patterning slit sheet. The deposition source nozzles of another row located at the first side of the patterning slit sheet may be arranged to face the second side of the patterning slit sheet.

The patterning slit sheet of the organic layer deposition apparatus may be smaller than the substrate.

According to an aspect of another embodiment according to the present invention, there is provided a method of manufacturing an organic light-emitting display device by using an organic layer deposition apparatus for forming an organic layer on a substrate. The method includes arranging the substrate to be spaced from the organic layer deposition apparatus; depositing a deposition material discharged from the organic layer deposition apparatus onto the substrate while the organic layer deposition apparatus and the substrate are moved relative to each other; forming a plurality of second electrodes on the organic layer so that the second electrodes are separated from each other; forming a passivation layer on each of the second electrodes to cover each of the second electrodes; and removing a part of the organic layer that exists between the second electrodes that are separated from each other.

The removing of the part of the organic layer between the second electrodes may include removing the part of the organic layer that exists in a region where the passivation layer is not formed, by using the passivation layer as a mask.

The removing of the part of the organic layer between the second electrodes may include removing the part of the organic layer by performing chemical etching in which plasma comprising oxygen $O_2$ is used.

The passivation layer may include Alq3(Tris(8-hydroxyquinolinato)aluminum).

The passivation layer may be larger than a corresponding one of the second electrodes so as to completely cover the corresponding one of the second electrodes.

According to another aspect of the inventive concept, there is provided an organic light-emitting display device manufactured according to one of the above-described methods.

According to an aspect of another embodiment according to the present invention, there is provided an organic light-emitting display device including a substrate including a plurality of panels; a plurality of thin film transistors on the substrate and including an active layer, a gate electrode, a source electrode, and a drain electrode; first electrodes electrically coupled to the thin film transistors and formed on the thin film transistors for the pixels; organic layers on the first electrodes, each of the organic layers including an emission layer; second electrodes corresponding to the panels and facing the first electrodes; and passivation layers on the second electrodes and covering the second electrodes.

The passivation layer may include Alq3(Tris(8-hydroxyquinolinato)aluminum).

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION OF THE EMBODIMENTS

Figure 1:
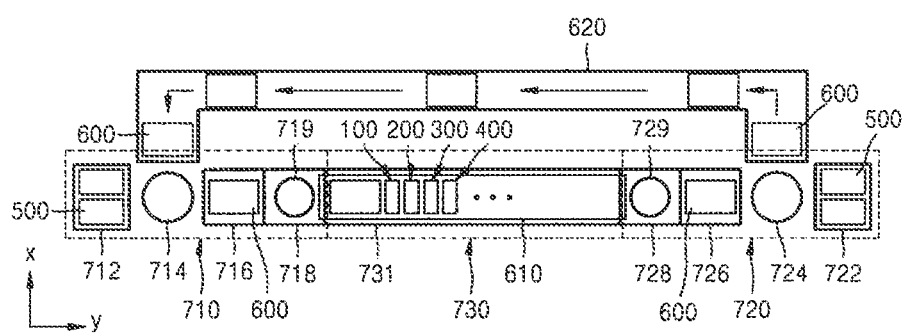
FIG. 1 is a schematic view of an organic layer deposition apparatus according to an embodiment of the present invention.

Reference will now be made in detail to embodiments, examples of which are illustrated in the accompanying drawings. In this regard, the embodiments described herein may be modified to have different forms and should not be construed as being limited to the descriptions set forth herein. FIG. 1 is a schematic view of an organic layer deposition apparatus according to an embodiment of the present invention.

Referring to FIG. 1, the thin film deposition apparatus (e.g., organic layer deposition apparatus) according to one embodiment includes a loading unit 710, a deposition unit 730, an unloading unit 720, a first conveyer unit 610, and a second conveyer unit 620.

The loading unit 710 may include a first rack 712, a transport robot 714, a transport chamber 716, and a first inversion chamber 718.

A plurality of substrates 500 onto which a deposition material is to be applied are stacked up on the first rack 712. The transport robot 714 picks up one of the substrates 500 from the first rack 712, places it on an electrostatic chuck 600 transferred by the second conveyor unit 620, and moves the electrostatic chuck 600 on which the substrate 500 is placed into the transport chamber 716.

The first inversion chamber 718 is located adjacently to the transport chamber 716. The first inversion chamber 718 includes a first inversion robot 719 that inverts the electrostatic chuck 600 and then loads it onto the first conveyer unit 610 of the deposition unit 730.

Figure 2:
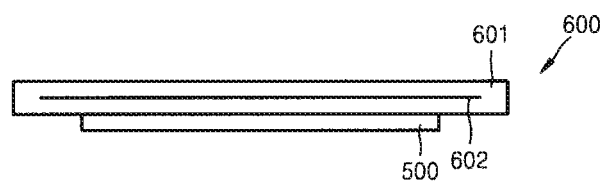
FIG. 2 is a cross-sectional view of an example of an electrostatic chuck of FIG. 1.

Referring to FIG. 2, the electrostatic chuck 600 may include an electrode 602 embedded in a main body 601 formed of ceramic, wherein the electrode 602 is supplied with power. The electrostatic chuck 600 may fix the substrate 500 on a surface of the main body 601 as a high voltage is applied to the electrode 602.

Referring to FIG. 1, the transport robot 714 places one of the substrates 500 on the surface of the electrostatic chuck 600, and the electrostatic chuck 600 on which the substrate 500 is placed is loaded into the transport chamber 716. The first inversion robot 719 inverts the electrostatic chuck 600 so that the substrate 500 is turned upside down in the deposition unit 730.

The unloading unit 720 is constituted (or configured) to operate in an opposite manner to the loading unit 710 described above. Specifically, a second inversion robot 729 in a second inversion chamber 728 inverts the electrostatic chuck 600, which has passed through the deposition unit 730 while the substrate 500 is located on the electrostatic chuck 600, and then moves the electrostatic chuck 600 on which the substrate 500 is located into an ejection chamber 726. Then, an ejection robot 724 removes the electrostatic chuck 600 on which the substrate 500 is located from the ejection chamber 726, separates the substrate 500 from the electrostatic chuck 600, and then loads the substrate 500 into a second rack 722. The electrostatic chuck 600 separated from the substrate 500 is returned back into the loading unit 710 via the second conveyer unit 620.

However, the present invention is not limited to the above description. For example, when placing the substrate 500 on the electrostatic chuck 600, the substrate 500 may be fixed onto a bottom surface of the electrostatic chuck 600 and then moved into the deposition unit 730. In such case, for example, the first inversion chamber 718 and the first inversion robot 719, and the second inversion chamber 728 and the second inversion robot 729 may not be required.

The deposition unit 730 may include at least one deposition chamber. As illustrated in FIG. 1, the deposition unit 730 may include a chamber 731. In the embodiment illustrated in FIG. 1, first to fourth organic layer deposition assemblies 100, 200, 300, and 400 may be located in the chamber 731. Although FIG. 1 illustrates that a total of four organic layer deposition assemblies, i.e., the first to fourth organic layer deposition assemblies 100 to 400, are installed in the chamber 731, the total number of organic layer deposition assemblies that may be installed in the chamber 731 may vary according to a deposition material and deposition conditions or requirements. The chamber 731 is maintained in a vacuum state during the deposition process.

In the embodiment illustrated in FIG. 1, the electrostatic chuck 600 on which the substrate 500 is placed may be moved at least to the deposition unit 730 or may be moved sequentially to the loading unit 710, the deposition unit 730, and the unloading unit 720, by the first conveyor unit 610. The electrostatic chuck 600 that is separated from the substrate 500 in the unloading unit 720 is moved back to the loading unit 710 by the second conveyor unit 620.

Figure 3:
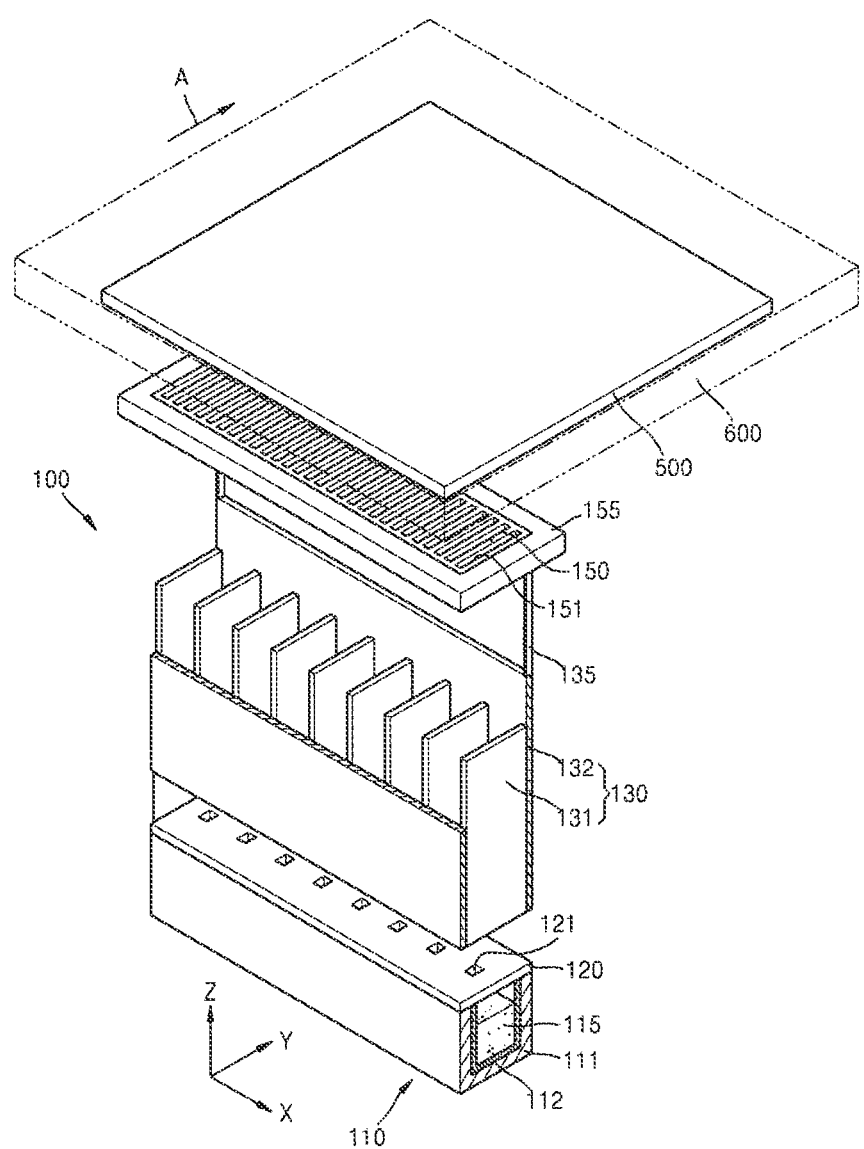
FIG. 3 is a schematic perspective view of an organic layer deposition assembly of the organic layer deposition apparatus of FIG. 1, according to an embodiment of the present invention.
Figure 4:
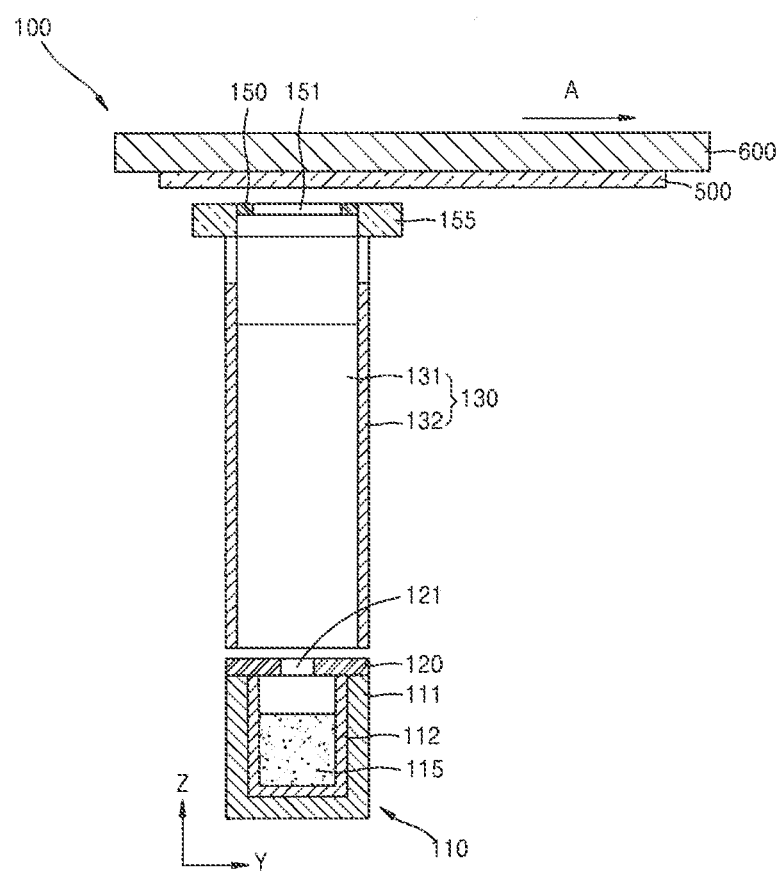
FIG. 4 is a schematic sectional side view of the organic layer deposition assembly illustrated in FIG. 3, according to an embodiment of the present invention.
Figure 5:
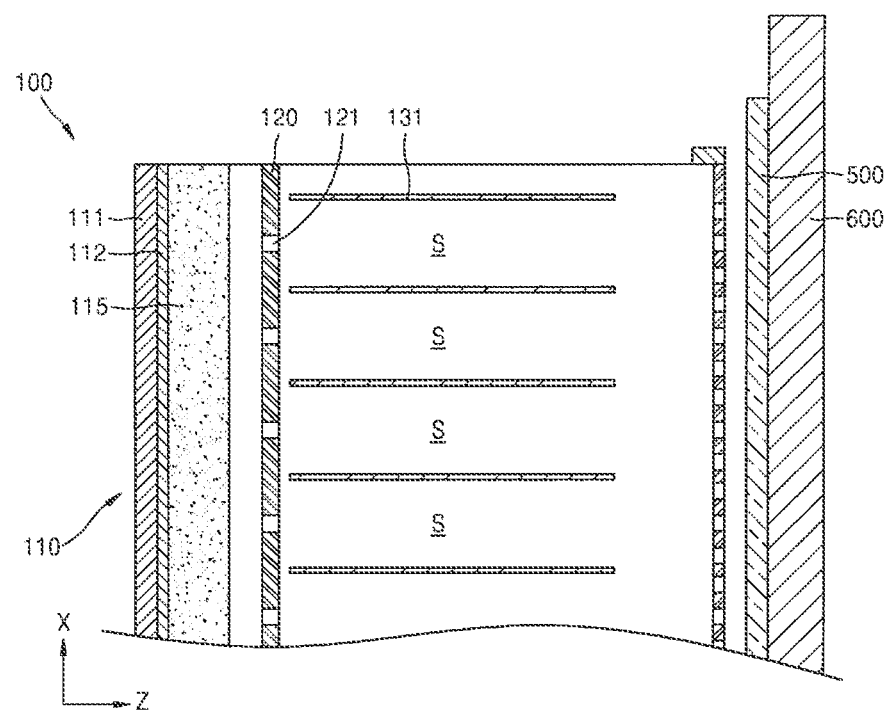
FIG. 5 is a schematic plan view of the organic layer deposition assembly illustrated in FIG. 3, according to an embodiment of the present invention.

Hereinafter, an embodiment of the organic layer deposition assembly 100 of the organic layer deposition apparatus illustrated in FIG. 1 will be described. FIG. 3 is a schematic perspective view of the organic layer deposition assembly 100 of the organic layer deposition apparatus of FIG. 1, FIG. 4 is a cross-sectional side view of the organic layer deposition assembly 100 illustrated in FIG. 3, and FIG. 5 is a cross-sectional plan view of the organic layer deposition assembly 100 illustrated in FIG. 3. The organic layer deposition assemblies 200, 300 and/or 400 may be substantially identical to the organic layer deposition assembly 100 or may be different.

Referring to FIGS. 3, 4 and 5, the organic layer deposition assembly 100 according to one embodiment of the present invention includes a deposition source 110, a deposition source nozzle unit 120, a barrier plate assembly 130, and a patterning slit sheet 150.

Although a chamber is not illustrated in FIGS. 3 through 5 for convenience of explanation, all the components of the organic layer deposition assembly 100 may be located within a chamber that is maintained at an appropriate degree of vacuum. The chamber is maintained at an appropriate vacuum in order to allow a deposition material to move in a substantially straight line through the organic layer deposition assembly 100.

In the chamber 731 of FIG. 1 in which the organic layer deposition assembly 100 is located, the substrate 500, which constitutes a deposition target on which a deposition material 115 is to be deposited, is transferred by the electrostatic chuck 600. The substrate 500 may be a substrate for flat panel displays. A large substrate, such as a mother glass, for manufacturing a plurality of flat panel displays, may be used as the substrate 500. Other substrates may also be employed.

In an embodiment, the substrate 500 and the organic layer deposition assembly 100 may be moved relative to each other. For example, as illustrated in FIG. 4, the substrate 500 may be moved in a direction of an arrow A, relative to the organic layer deposition assembly 100. In other embodiments, the organic layer deposition assembly 100 may be moved in a direction opposite to the arrow A direction or both the substrate 500 and the organic layer deposition assembly 100 may be moved with respect to each other in opposite directions.

In a conventional deposition method using a fine metal mask (FMM), the size of the FMM is greater than or equal to the size of a substrate. Thus, the size of the FMM is increased as the substrate becomes larger. However, it is neither straightforward to manufacture a large FMM nor to extend an FMM to be accurately aligned with a pattern.

In order to overcome this problem, in the organic layer deposition assembly 100 according to one embodiment of the present invention, deposition may be performed while the organic layer deposition assembly 100 and the substrate 500 are moved relative to each other. In other words, deposition may be continuously performed while the substrate 500, which is arranged so as to face the organic layer deposition assembly 100, is moved in a Y-axis direction. In other words, deposition may be performed in a scanning manner while the substrate 500 is moved in a direction of arrow A in FIG. 3. Although the substrate 500 is illustrated as being moved in the Y-axis direction in FIG. 3 within the chamber 731 when deposition is performed, the present invention is not limited thereto. Deposition may be performed while the organic layer deposition assembly 100 is moved in the Y-axis direction, while the substrate 500 is fixed, or both the substrate 500 and the organic layer deposition assembly 100 may be moved in opposite directions.

Thus, in the organic layer deposition assembly 100 according to one embodiment of the present invention, a patterning slit sheet 150 may be significantly smaller than an FMM used in a conventional deposition method. In other words, in the organic layer deposition assembly 100, deposition is continuously performed, i.e., in a scanning manner while the substrate 500 is moved in the Y-axis direction. Thus, a length of the patterning slit sheet 150 in the Y-axis direction may be less (e.g., significantly less) than a length of the substrate 500 provided a width of the patterning slit sheet 150 in the X-axis direction and a width of the substrate 500 in the X-axis direction are substantially equal to each other. However, even when the width of the patterning slit sheet 150 in the X-axis direction is less than the width of the substrate 500 in the X-axis direction, deposition may be performed on the entire substrate 500 in a scanning manner while the substrate 500 and the organic layer deposition assembly 100 are moved relative to each other.

As described above, since the patterning slit sheet 150 may be significantly smaller than an FMM used in a conventional deposition method, it is relatively easy to manufacture the patterning slit sheet 150. Further, using the patterning slit sheet 150, which is smaller than an FMM used in a conventional deposition method, is more convenient in all processes, including etching and other subsequent processes, such as precise extension, welding, moving, and cleaning processes, compared to the conventional deposition method using a larger FMM. This is more advantageous for manufacturing a relatively large display device.

In order to perform deposition while the organic layer deposition assembly 100 and the substrate 500 are moved relative to each other as described above, the organic layer deposition assembly 100 and the substrate 500 may be separated (or spaced) from each other (e.g., by a predetermined distance). This will be described later in detail.

The deposition source 110 that contains and heats the deposition material 115 is located at an opposite side of the chamber to a side at which the substrate 500 is located.

The deposition source 110 includes a crucible 112 that is filled with the deposition material 115, and a cooling block 111 surrounding the crucible 112. The cooling block 111 prevents radiation of heat from the crucible 112 to the outside (e.g., into the chamber 731 of FIG. 1), The cooling block 111 may include a heater that heats the crucible 112.

A deposition source nozzle unit 120 is located at a side of the deposition source 110, and for example, at the side of the deposition source 110 facing the substrate 500. The deposition source nozzle unit 120 includes a plurality of deposition source nozzles (or deposition source nozzle slits) 121 arranged at equal intervals (e.g., regular intervals) in the X-axis direction. The deposition material 115 that is vaporized in the deposition source 110 passes through the deposition source nozzles 121 of the deposition source nozzle unit 120 towards the substrate 500, which constitutes a target on which the deposition material 115 is to be deposited.

A barrier plate assembly 130 is located at a side of the deposition source nozzle unit 120. The barrier plate assembly 130 includes a plurality of barrier plates 131, and a barrier plate frame 132 that covers sides of the barrier plates 131. The plurality of barrier plates 131 may be arranged parallel to each other at equal intervals in the X-axis direction. In addition, each of the barrier plates 131 may be arranged in parallel to a YZ plane in FIG. 3, and may have a rectangular shape. The plurality of barrier plates 131 arranged as described above partitions the space between the deposition source nozzle unit 120 and the patterning slit sheet 150 into a plurality of sub-deposition spaces S (see FIG. 5). In the organic layer deposition assembly 100 according to one embodiment of the present invention, as illustrated in FIG. 5, the deposition space is divided by the barrier plates 131 into the sub-deposition spaces S that respectively correspond to the deposition source nozzles 121 through which the deposition material 115 is discharged.

The barrier plates 131 may be respectively located between adjacent deposition source nozzles 121. In other words, each of the deposition source nozzles 121 may be located between two adjacent barrier plates 131. The deposition source nozzles 121 may be respectively located at the midpoint between two adjacent barrier plates 131. However, the present invention is not limited to this structure. For example, two or more of the plurality of deposition source nozzles 121 may be located between two adjacent barrier plates 131. In this case, the two or more deposition source nozzles 121 between two adjacent barrier plates 131 may be also respectively located at the midpoint between the two adjacent barrier plates 131.

As described above, since the barrier plates 131 partition the space between the deposition source nozzle unit 120 and the patterning slit sheet 150 into the plurality of sub-deposition spaces S, the deposition material 115 discharged through each of the deposition source nozzles 121 is not mixed with the deposition material 115 discharged through the other deposition source nozzles 121, and passes through patterning slits 151 so as to be deposited on the substrate 500. In other words, the barrier plates 131 guide the deposition material 115, which is discharged through the deposition source nozzles 121, to move straight in the Y-axis direction, and not to flow in the X-axis direction.

As described above, the deposition material 115 is forced to move straight by installing the barrier plates 131, so that a smaller shadow zone may be formed on the substrate 500 compared to a case where no barrier plates are installed. Thus, the organic layer deposition assembly 100 and the substrate 400 can be separated from each other (e.g., by a predetermined distance). This will be described later in detail.

The patterning slit sheet 150 and a frame 155, which surrounds and binds the patterning slit sheet 150, are located between the deposition source 110 and the substrate 500. The frame 155 may be formed in a lattice shape, similar to a window frame. The patterning slit sheet 150 is bound inside the frame 155. The patterning slit sheet 150 includes a plurality of patterning slits 151 arranged in (e.g., located at equal or regular intervals along) the X-axis direction. Each of the patterning slits 151 extends in the Y-axis direction. The deposition material 115 that has been vaporized in the deposition source 110 and passed through the deposition source nozzle 121 passes through the patterning slits 151 towards the substrate 500.

The patterning slit sheet 150 may be formed of a metal thin film. The patterning slit sheet 150 is fixed to the frame 155 such that a tensile force is exerted thereon. For example, the patterning slit sheet 150 may be tightly stretched or pulled toward the frame 155 by exerting force in opposite directions along the X-axis and/or Y-axis directions. The patterning slits 151 may be formed by etching the patterning slit sheet 150 to a stripe pattern. The number of patterning slits 151 may be equal to the number of deposition patterns to be formed on the substrate 500.

In addition, the barrier plate assembly 130 and the patterning slit sheet 150 may be located to be separated (e.g., spaced) from each other (e.g., by a predetermined distance). Alternatively, the barrier plate assembly 130 and the patterning slit sheet 150 may be coupled (e.g., connected) to each other by a connection member 135.

As described above, the organic layer deposition assembly 100 according to one embodiment of the present invention performs deposition while being moved relative to the substrate 500. In order to move the organic layer deposition assembly 100 relative to the substrate 500, the patterning slit sheet 150 is separated from the substrate 500 (e.g., by a predetermined distance). In addition, in order to prevent the formation of a relatively large shadow zone on the substrate 500 when the patterning slit sheet 150 and the substrate 400 are separated from each other, the barrier plates 131 are arranged between the deposition source nozzle unit 120 and the patterning slit sheet 150 to force the deposition material 115 to move in a straight direction. Thus, the size of the shadow zone that may be formed on the substrate 500 may be reduced (e.g., sharply reduced).

In a conventional deposition method using an FMM, deposition is performed with the FMM in close contact with a substrate in order to prevent formation of a shadow zone on the substrate. However, when the FMM is used in close contact with the substrate, the contact may cause defects, such as scratches on patterns formed on the substrate. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the organic layer deposition assembly 100 according to one embodiment of the present invention, the patterning slit sheet 150 is located to be separated from the substrate 500 (e.g., by a predetermined distance). This may be facilitated by installing the barrier plates 131 to reduce the size of the shadow zone formed on the substrate 500.

A thin film such as an organic layer or the like of an organic light-emitting display device may be formed with an organic layer deposition apparatus having the structure described above. This will be described later in greater detail with reference to FIG. 10.

Figure 6:
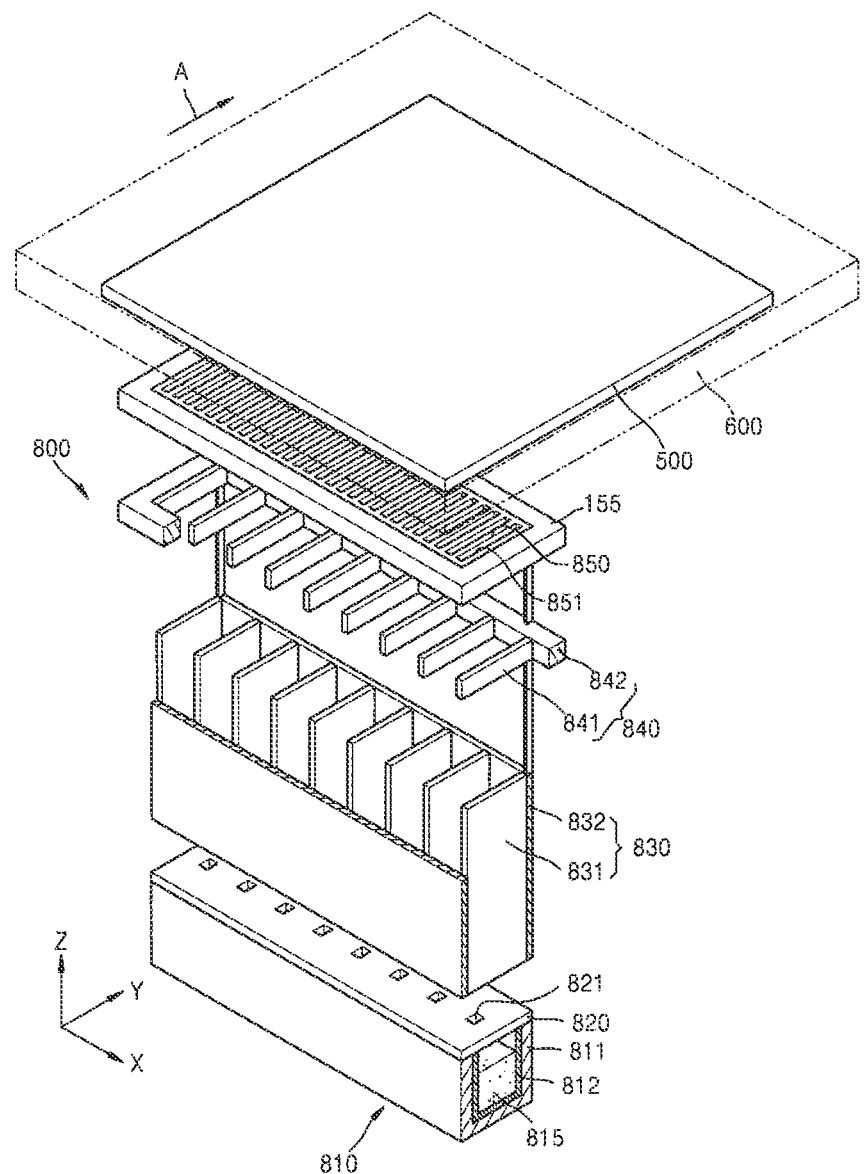
FIG. 6 is a schematic perspective view of an organic layer deposition assembly according to another embodiment of the present invention.

FIG. 6 is a schematic perspective view of an organic layer deposition assembly 800 according to another embodiment of the present invention. The organic layer deposition assembly 800, for example, may be used as one or more of the organic layer deposition assemblies 100, 200, 300 and 400 illustrated in FIG. 1.

Referring to FIG. 6, the organic layer deposition assembly 800 according to one embodiment of the present invention includes a deposition source 810, a deposition source nozzle unit 820, a first barrier plate assembly 830, a second barrier plate assembly 840, and a patterning slit sheet 850. Structures of the deposition source 810, the first barrier plate assembly 830, and the patterning slit sheet 850 are the same or substantially the same as those in the embodiment described with reference to FIG. 3, and thus a detailed description thereof will not be provided here. The embodiment illustrated in FIG. 6 is different from the embodiment illustrated in FIG. 3 in that the second barrier plate assembly 840 is located at a side of the first barrier plate assembly 830. Here, the second barrier plate assembly 840 is located between the first barrier plate assembly 830 and the patterning slit sheet 850.

The deposition source 810 includes a crucible 812 that is filled with the deposition material 115, and a cooling block 811 surrounding the crucible 812. The cooling block 811 prevents radiation of heat from the crucible 812 to the outside (e.g., into the chamber 731 of FIG. 1). The cooling block 811 may include a heater that heats the crucible 112.

The second barrier plate assembly 840 includes a plurality of second barrier plates 841, and a second barrier plate frame 842 that covers sides of the second barrier plates 841. The plurality of second barrier plates 841 may be arranged in parallel to each other at equal intervals (e.g., regular intervals) in the X-axis direction. In addition, each of the second barrier plates 841 may be formed to extend in the YZ plane in FIG. 6, i.e., perpendicular to the X-axis direction.

The plurality of first barrier plates 831 and the plurality of second barrier plates 841 arranged as described above partition the space between the deposition source nozzle unit 820 and the patterning slit sheet 850. The deposition space is divided by the first barrier plates 831 and the second barrier plates 841 into sub-deposition spaces that respectively correspond to the deposition source nozzles 821 through which a deposition material 815 is discharged.

The second barrier plates 841 may be located to correspond respectively to the first barrier plates 831. In other words, the second barrier plates 841 may be respectively located to be parallel to and to be on the same plane as the first barrier plates 831. Each pair of the corresponding first and second barrier plates 831 and 841 may be located on the same plane. Although the first barrier plates 831 and the second barrier plates 841 are respectively illustrated as having the same thickness in the X-axis direction, aspects of the present invention are not limited thereto. In other words, the second barrier plates 841, which are precisely aligned with the patterning slits 851, may be formed to be relatively thin, whereas the first barrier plates 831, which may or may not be precisely aligned with the patterning slits 851, may be formed to be relatively thick. This makes it easier to manufacture the organic layer deposition assembly.

Figure 7:
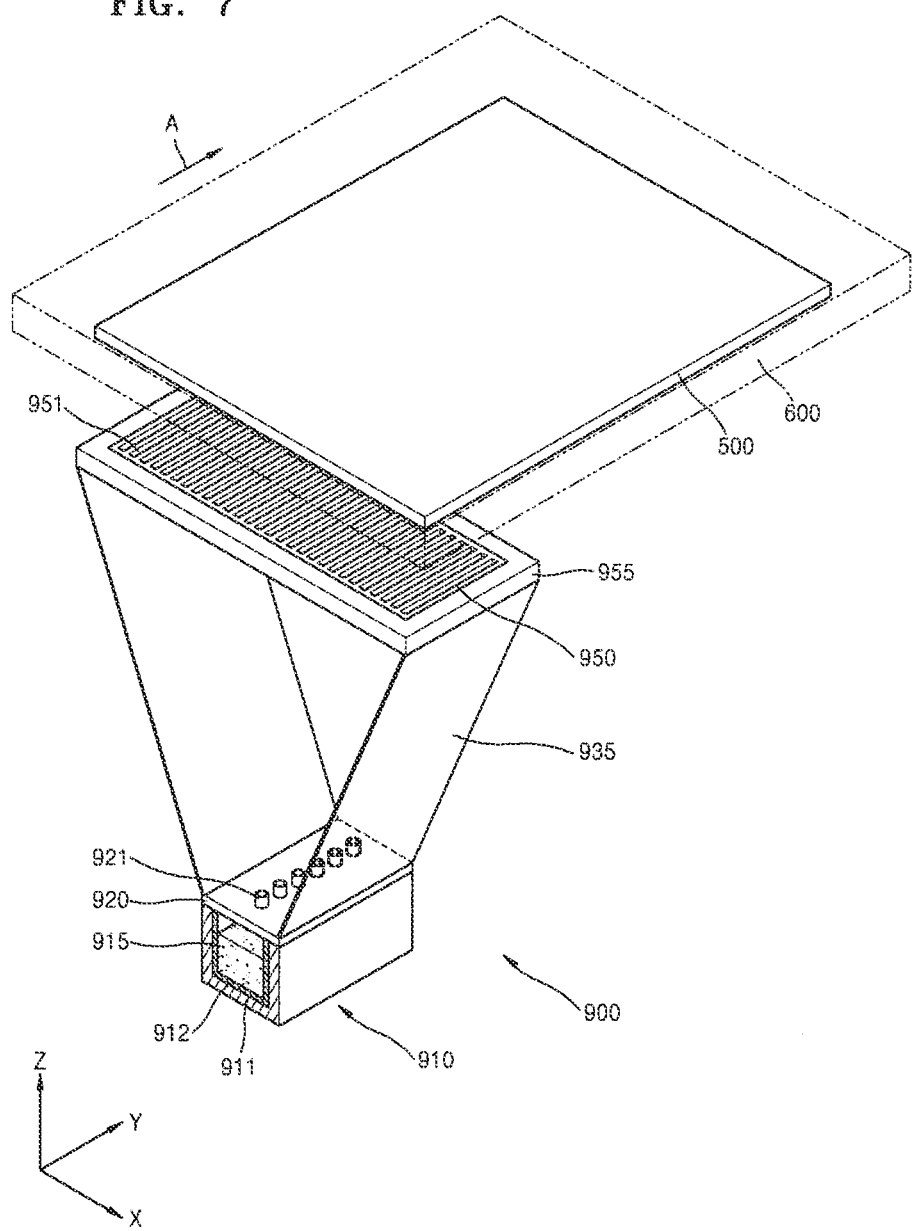
FIG. 7 is a schematic perspective view of an organic layer deposition assembly according to another embodiment of the present invention.

FIG. 7 is a schematic perspective view of an organic layer deposition assembly 900 according to another embodiment of the present invention. The organic layer deposition assembly 900, for example, may be used as one or more of the organic layer deposition assemblies 100, 200, 300 and 400 illustrated in FIG. 1.

Referring to FIG. 7, the organic layer deposition assembly 900 according to one embodiment includes a deposition source 910, a deposition source nozzle unit 920, and a patterning slit sheet 950.

The deposition source 910 includes a crucible 912 that is filled with a deposition material 915, and a heater 911 that heats the crucible 912 to vaporize the deposition material 915, which is contained in the crucible 912, so as to move the vaporized deposition material 915 to the deposition source nozzle unit 920. The deposition source nozzle unit 920 is located at a side of the deposition source 910. The deposition source nozzle unit 920 includes a plurality of deposition source nozzles 921 arranged in (e.g., located at equal or regular intervals along) the Y-axis direction. The patterning slit sheet 950 and a frame 955 are located between the first deposition source 910, the deposition source nozzle unit 920, and the substrate 500, and the patterning slit sheet 950 includes a plurality of patterning slits 951 arranged in (e.g., located at equal or regular intervals along) the X-axis direction. In addition, the deposition source 910 and the deposition source nozzle unit 920 may be coupled (e.g., connected) to the patterning slit sheet 950 by a connection member 935.

In the embodiment illustrated in FIG. 7, the deposition source nozzles 921 formed in the deposition source nozzle unit 920 are arranged along the Y-axis direction, unlike the embodiment illustrated in FIG. 3. Thus, this difference between the two embodiments will be described in detail.

The deposition source nozzle unit 920 is located at a side of the deposition source 910, and in particular, at the side of the deposition source 910 facing the substrate 500. The deposition source nozzle unit 920 includes a plurality of deposition source nozzles 921 arranged at equal intervals (e.g., regular intervals) in the Y-axis direction, i.e., a scanning direction of the substrate 500. The deposition material 915 that is vaporized in the deposition source 910, passes through the deposition source nozzle unit 920 towards the substrate 500. As described above, when the deposition source nozzle unit 920 includes the plurality of deposition source nozzles 921 arranged in the Y-axis direction, that is, in the scanning direction of the substrate 500, the size of a pattern formed of the deposition material discharged through patterning slits 951 of the patterning slit sheet 950 is affected by the size of one of the deposition source nozzles 921 (since there is only one deposition nozzle in the X-axis direction), and thus no shadow zone (or substantially no shadow zone) may be formed on the substrate 500. In addition, since the plurality of deposition source nozzles 921 are arranged in the scanning direction of the substrate 400, even if there is a difference between fluxes of the deposition source nozzles 921, the difference may be compensated for, thereby constantly maintaining deposition uniformity.

Figure 8:
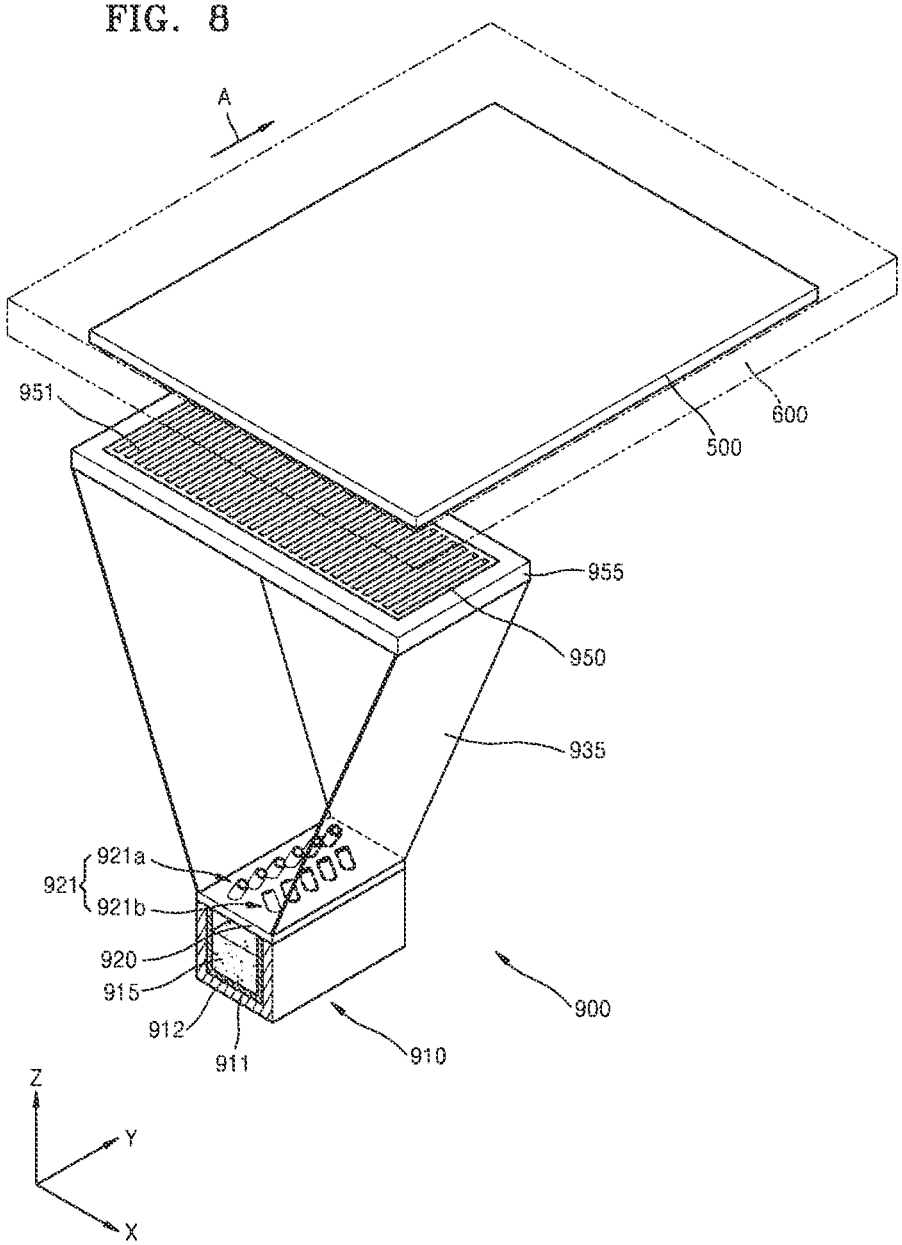
FIG. 8 is a schematic perspective view of an organic layer deposition assembly according to another embodiment of the present invention.

FIG. 8 is a schematic perspective view of an organic layer deposition assembly 900' according to another embodiment of the present invention. Referring to FIG. 8, the thin film deposition apparatus 900' according to one embodiment includes a deposition source 910, a deposition source nozzle unit 920, and a patterning slit sheet 950. The organic layer deposition assembly 900', for example, may be used as one or more of the organic layer deposition assemblies 100, 200, 300 and 400 illustrated in FIG. 1.

In the embodiment illustrated in FIG. 8, a plurality of deposition source nozzles 921 formed on the deposition source nozzle unit 920 are tilted (e.g., at a predetermined angle), unlike the embodiment described with reference to FIG. 7. The deposition source nozzles 921 may include deposition source nozzles 921a and 921b arranged in respective rows. The deposition source nozzles 921a and 921b may be arranged in respective rows to alternate in a zigzag pattern. The deposition source nozzles 921a and 921b may be tilted by a predetermined angle with respect to an XZ plane.

In other words, in the embodiment of the present invention illustrated in FIG. 8, the deposition source nozzles 921a and 921b are arranged to tilt at an angle (e.g., a predetermined angle) with respect to the patterning slit sheet 950 and to each other. The deposition source nozzles 921a of a first row and the deposition source nozzles 921b of a second row may tilt to face each other. That is, the deposition source nozzles 921a of the first row in a left part of the deposition source nozzle unit 920 may be arranged to face a right side portion of the patterning slit sheet 950, and the deposition source nozzles 921b of the second row in a right part of the deposition source nozzle unit 920 may be arranged to face a left side portion of the patterning slit sheet 950.

Due to the structure of the organic layer deposition assembly 900' according to one embodiment, the deposition of the deposition material 915 may be adjusted to reduce a film thickness variation between the center and the end portions of the substrate 500 and improve thickness uniformity of the deposition film. Moreover, utilization efficiency of the deposition material 915 may also be improved.

Figure 9:
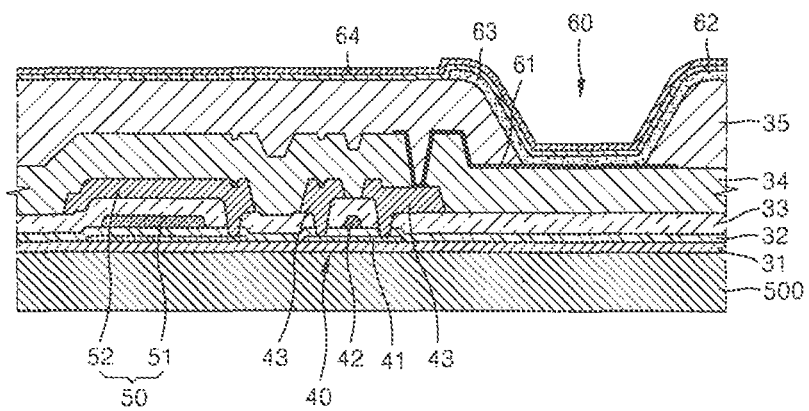
FIG. 9 is a cross-sectional view of an active matrix organic light-emitting display device fabricated by using an organic layer deposition apparatus; according to an embodiment of the present invention.

FIG. 9 is a cross-sectional view of an active matrix organic light-emitting display device fabricated by using an organic layer deposition apparatus, according to an embodiment of the present invention.

Referring to FIG. 9, the active matrix organic light-emitting display device according to one embodiment is formed on a substrate 500. The substrate 500 may be formed of a transparent material, for example, glass, plastic or metal. An insulating layer 31, such as a buffer layer, is formed on an entire surface of the substrate 500.

A thin film transistor (TFT) 40, a capacitor 50, and an organic light-emitting diode (OLED) 60 are located on the insulating layer 31, as illustrated in FIG. 9.

A semiconductor active layer 41 is formed on an upper surface of the insulating layer 31 (e.g., formed in a predetermined pattern). A gate insulating layer 32 is formed to cover the semiconductor active layer 41. The semiconductor active layer 41 may include a p-type or n-type semiconductor material.

A gate electrode 42 of the TFT 40 is formed in a region of the gate insulating layer 32 corresponding to the semiconductor active layer 41. An interlayer insulating layer 33 is formed to cover the gate electrode 42. The interlayer insulating layer 33 and the gate insulating layer 32 are etched by, for example, dry etching, to form a contact hole exposing parts of the semiconductor active layer 41.

A source/drain electrode 43 is formed on the interlayer insulating layer 33 to contact the semiconductor active layer 41 through the contact hole. A passivation layer 34 is formed to cover the source/drain electrode 43, and is etched to expose a part of the drain electrode 43. An insulating layer (not shown) may be further formed on the passivation layer 34 so as to planarize the passivation layer 34.

In addition, the OLED 60 displays image information (e.g., predetermined image information) by emitting red, green, or blue light as current flows. The OLED 60 includes a first electrode 61 located on the passivation layer 34. The first electrode 61 is electrically connected to the drain electrode 43 of the TFT 40.

A pixel defining layer 35 is formed to cover the first electrode 61. An opening is formed in the pixel defining layer 35, and then an organic layer 63, including an emission layer, is formed in a region defined by the opening 64. A second electrode 62 is formed on the organic layer 63.

The pixel defining layer 35, which defines individual pixels, is formed of an organic material. The pixel defining layer 35 also planarizes a region of the surface of the substrate 500, and in particular, the surface of the passivation layer 34, on which the first electrode 61 is formed.

The first electrode 61 and the second electrode 62 are insulated from each other, and respectively apply voltages of opposite polarities to the organic layer 63, including the emission layer, to induce light emission.

The organic layer 63 including the emission layer is a low molecular weight organic layer or a high molecular weight organic layer. When the organic layer 63 is a low molecular weight organic layer, the organic layer 63 may be formed as a single- or multi-layered stack structure including at least one layer selected from the group consisting of a hole injection layer (HIL), a hole transport layer (HTL), an emission layer (EML), an electron transport layer (ETL) and an electron injection layer (EIL).

After the organic layer 63 is formed, the second electrode 62 may be formed by the same deposition method as used to form the organic layer 63.

The first electrode 61 may function as an anode, and the second electrode 62 may function as a cathode. Alternatively, the first electrode 61 may function as a cathode, and the second electrode 62 may function as an anode. The first electrode 61 may be patterned to correspond to individual pixel regions, and the second electrode 62 may be formed (e.g., as a common electrode) to cover all the pixels.

The first electrode 61 may be formed as a transparent electrode or a reflective electrode. The transparent electrode may be formed of indium tin oxide (ITO), indium zinc oxide (IZO), zinc oxide (ZnO), or indium oxide ($In_2O_3$). The reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof, and forming a transparent electrode layer of ITO, IZO, ZnO, or $In_2O_3$ on the reflective layer. The first electrode 61 may be formed by forming a layer by, for example, sputtering, and then patterning the layer by, for example, photolithography.

The second electrode 62 may also be formed as a transparent electrode or a reflective electrode. When the second electrode 62 is formed as a transparent electrode, the second electrode 62 may function as a cathode. To this end, the transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof, on a surface of the organic layer 63 including the emission layer and forming an auxiliary electrode layer or a bus electrode line thereon from ITO, IZO, ZnO, $In_2O_3$, or the like. When the second electrode 62 is formed as a reflective electrode, the reflective electrode may be formed by depositing Li, Ca, LiF/Ca, LiF/Al, Al, Ag, Mg, or a compound thereof, on the organic layer 63 including the emission layer. The second electrode 62 may be formed by using the same deposition method as used to form the organic layer 63 including the emission layer described above.

A passivation layer 64 is formed on the second electrode 62. The passivation layer 64 is formed on the second electrode 62 to function as a mask when removing a part of the organic layer 63 corresponding to a region other than a pixel region and to also perform a function of protecting the second electrode 62. This will be described later in detail with reference to FIG. 10.

The organic layer deposition apparatuses according to the embodiments of the present invention described above may be applied to form an organic layer or an inorganic layer of an organic TFT, and to form layers from various materials.

Hereinafter, a method of manufacturing an organic light-emitting display device by using the organic layer deposition apparatus of FIG. 3 or the like will be described in detail.

Figure 10:
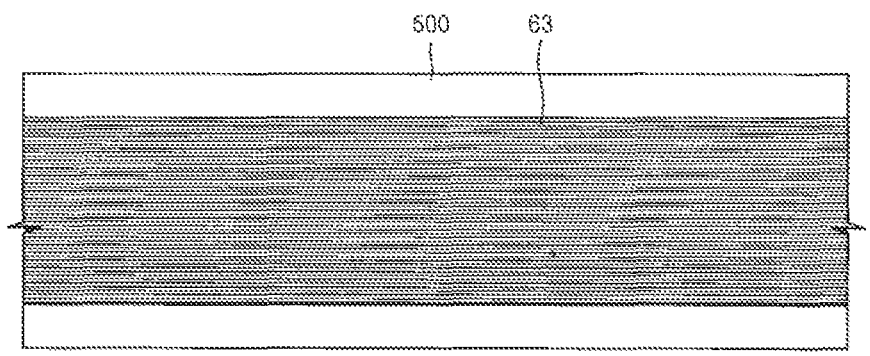
FIGS. 10 through 12 are cross-sectional views for describing a method of manufacturing an organic light emitting display device, according to an embodiment of the present invention.
Figure 11:
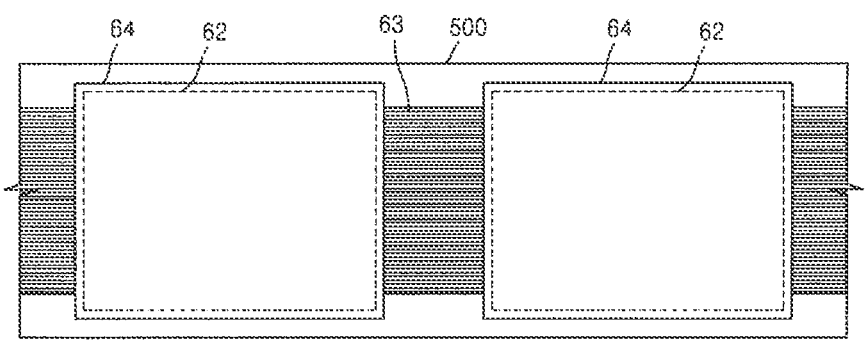
Figure 12:
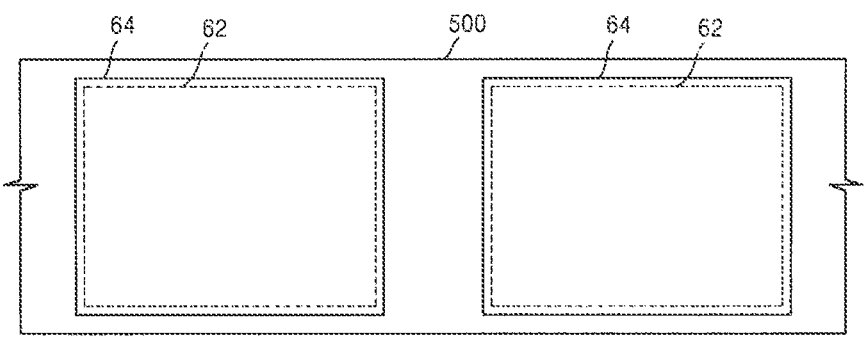

FIGS. 10 through 12 are cross-sectional views for describing a method of manufacturing an organic light emitting display device, according to an embodiment of the present invention.

First, the TFT 40 of FIG. 9, the capacitor 50 of FIG. 9, the first electrode 61 of FIG. 9, and the pixel defining layer 35 of FIG. 9 are sequentially formed on the substrate 500.

Next, as illustrated in FIG. 10, the organic layer 63 is formed on the first electrode 61 of FIG. 9 and the pixel defining layer 35 of FIG. 9 of the substrate 500 by using the organic layer deposition apparatus illustrated in FIG. 3 or the like.

As described above, an organic layer deposition apparatus according to an embodiment of the present invention includes a patterning slit sheet of a size smaller (e.g., significantly smaller) than an FMM used in a conventional deposition method. In order to form an organic layer on a substrate by using such a patterning slit sheet, deposition is performed while the organic layer deposition apparatus and the substrate are moving relative to each other. Since deposition is performed in a scanning manner with the substrate moving in one direction as described above, organic layers 63 are consecutively formed in a line shape on the substrate 500 on which deposition has been completed, as illustrated in FIG. 10.

However, as organic light emitting display devices become larger, a plurality of panels (that is, organic light emitting display devices) may be formed on a single mother glass. Each panel includes a pixel region through which light is emitted, and a circuit region around the pixel region. Such a circuit region is used as a terminal during product manufacture or subsequent product test. If an organic layer is formed in the circuit region, it is difficult to function as an electrode. Thus, the circuit region has to be a non-film-formation region where an organic material film or the like is not formed. However, as described above, since the organic layer deposition apparatus according to embodiments of the present invention performs deposition in a scanning manner while the substrate 50 is moving relative to the organic layer deposition apparatus, it is not easy to prevent deposition of an organic material on a circuit region of the substrate 500.

To address this problem, an attempt has been made to shield the non-film-formation region by including a special device such as a shutter, a blinder, or the like. However, in this case, the inclusion of the special device may cause degradation of space utilization within the organic layer deposition apparatus and an increase in the manufacturing costs of the organic layer deposition apparatus. Another attempt has been made to remove a part of an organic layer from the non-film-formation region by using the second electrode 62 of FIG. 9 as a mask after the formation of the second electrode 62. However, in this case, even the second electrode 62 may be damaged while the part of the organic layer is being removed from the non-film-formation region, thereby failing to function as an electrode.

In order to address this problem, in the method of manufacturing an organic light emitting display device, according to one embodiment of the present invention, a passivation layer 64 is formed on the second electrode 62 of FIG. 9 so as to function as a mask for removing a part of an organic layer from a non-film-formation region and to protect the second electrode 62 of FIG. 9 during the organic material removal.

In detail, as illustrated in FIG. 11, the second electrode 62 and the passivation layer 64 are sequentially formed on the organic layers 63. The second electrode 62 and the passivation layer 64 are formed to correspond to individual pixel regions (e.g., the display region) of each panel. That is, the second electrode 62 and the passivation layer 64 are not formed in a circuit region, that is, in the non-film-formation region. The passivation layer 64 may be formed of an organometalic compound including a metal ligand such as Alq3(Tris (8-hydroxyquinolinato)aluminum), and may have a thickness of 1000 Å or greater. The passivation layer 64 may be formed slightly larger than the second electrode 62 so as to completely cover the second electrode 62. Accordingly, the pixel region, that is, a film-formation region, is entirely covered by the second electrode 62 and the passivation layer 64, whereas the circuit region, that is, the non-film-formation region, is exposed.

In this state, when plasma etching is performed, as illustrated in FIG. 12, parts of the organic layers 63 are entirely removed from the circuit region of each panel. The parts of the organic layers 63 formed on the circuit region may be removed using a chemical etching method in which plasma including oxygen $O_2$ is used. Since such plasma etching is well known, a detailed description thereof will be omitted.

According to embodiments of the present invention as described above, the use of an additional mask for removing a part of an organic layer from a non-film-formation region of each panel is unnecessary, and oxidation of a second electrode and damage to the organic layer below the second electrode may be prevented from occurring when a part of the organic layer on the non-film-formation region is removed by using the second electrode as a mask, and oxygen used during etching out of an organic material may be prevented from penetrating into an organic light emitting display device.

A method of manufacturing an organic light emitting display device and an organic light emitting display device manufactured using the method as described above are suitable for manufacturing large-sized display devices on a mass scale and can be used for high-definition patterning.

While the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A method of manufacturing an organic light emitting display device, the method comprising:
consecutively forming organic layers on a substrate on which a plurality of panels are arranged side by side;
forming a second electrode on the organic layers, for each of the panels;
forming a passivation layer on the second electrode on each of the panels to cover the second electrode, the organic layers between the panels being exposed between the passivation layers on respective said panels; and
removing a part of the organic layers that exists between the passivation layer on the second electrode of one of the panels and the passivation layer on the second electrode of an adjacent one of the panels,
wherein the passivation layer is larger than the second electrode so as to completely cover the second electrode.

2. The method of claim 1, wherein the removing of the part of the organic layers comprises removing the part of the organic layers that exists in a region where the passivation layer is not fanned, by using the passivation layer as a mask.

3. The method of claim 1, wherein the removing of the part of the organic layers comprises removing the part of the organic layers by performing chemical etching in which plasma comprising oxygen is used.

4. The method of claim 1, wherein each of the panels comprises a circuit region and a pixel region, and the second electrode and the passivation layer are formed in the pixel region.

5. The method of claim 4, wherein the removing of the part of the organic layers comprises removing an organic material deposited in the circuit region.

6. The method of claim 1, wherein the passivation layer comprises Alq3(Tris(8-hydroxyquinolinato)aluminum).

7. The method of claim 1, wherein during the consecutive forming of the organic layers, an organic layer deposition apparatus is spaced from the substrate, and deposition is performed on the substrate while the substrate and the organic layer deposition apparatus are moving relative to each other, wherein the organic layer deposition apparatus comprises a deposition source for emitting a deposition material, a deposition source nozzle unit located at a side of the deposition source and comprising a plurality of deposition source nozzles arranged in a first direction, a patterning slit sheet located opposite to the deposition source nozzle unit and comprising a plurality of patterning slits arranged in the first direction, and a barrier plate assembly comprising a plurality of barrier plates that are arranged in the first direction between the deposition source nozzle unit and the patterning slit sheet and that partition the space between the deposition source nozzle unit and the patterning slit sheet into a plurality of sub-deposition spaces.

8. The method of claim 7, wherein each of the plurality of barrier plates extends in a second direction that is substantially perpendicular to the first direction, in order to partition the space between the deposition source nozzle unit and the patterning slit sheet into the plurality of sub-deposition spaces.

9. The method of claim 7, wherein the barrier plate assembly comprises a first barrier plate assembly comprising a plurality of first barrier plates, and a second barrier plate assembly comprising a plurality of second barrier plates.

10. The method of claim 9, wherein each of the first barrier plates and. each of the second barrier plates extend in a second direction that is substantially perpendicular to the first direction, in order to partition the space between the deposition source nozzle unit and the patterning slit sheet into the plurality of sub-deposition spaces.

11. The method of claim 7, wherein the patterning slit sheet of the organic layer deposition apparatus is smaller than the substrate.

12. The method of claim 1, wherein an organic layer deposition apparatus is separated from the substrate, and deposition is performed on the substrate while the substrate and the organic layer deposition apparatus are moving relative to each other, wherein the organic layer deposition apparatus comprises a deposition source for emitting a deposition material, a deposition source nozzle unit located at a side of the deposition source and comprising a plurality of deposition source nozzles arranged in a first direction, and a patterning slit sheet located opposite to the deposition source nozzle unit and comprising a plurality of patterning slits arranged in a second direction that is substantially perpendicular to the first direction.

13. The method of claim 12, wherein the plurality of deposition source nozzles tilt at an angle.

14. The method of claim 13, wherein the plurality of deposition source nozzles comprises deposition source nozzles arranged in two rows formed in the first direction, and the deposition source nozzles in the two rows are tilted to face each other.

15. The method of claim 13, wherein:
the plurality of deposition source nozzles comprises deposition source nozzles arranged in two rows formed in the first direction;
the deposition source nozzles of one of the rows located at a second side of the patterning slit sheet are arranged to face a first side of the patterning slit sheet; and
the deposition source nozzles of another one of the rows located at the first side of the patterning slit sheet are arranged to face the second side of the patterning slit sheet.

16. The method of claim 12, wherein the patterning slit sheet of the organic layer deposition apparatus is smaller than the substrate.

17. A method of manufacturing an organic light-emitting display device by using an organic layer deposition apparatus for forming an organic layer on a substrate, the method comprising:
arranging the substrate to be spaced from the organic layer deposition apparatus;
depositing a deposition material discharged from the organic layer deposition apparatus onto the substrate to form an organic layer while the organic layer deposition apparatus and the substrate are moved relative to each other;
forming a plurality of second electrodes on the organic layer so that the second electrodes are separated from each other;
forming a passivation layer on each of the second electrodes to cover each of the second electrodes; and
removing a part of the organic layer that exists between the second electrodes that are separated from each other.

18. The method of claim 17, wherein the removing of the part of the organic layer between the second electrodes comprises removing the part of the organic layer that exists in a region where the passivation layer is not formed, by using the passivation layer as a mask.

19. The method of claim 17, wherein the removing of the part of the organic layer between the second electrodes comprises removing the part of the organic layer by performing chemical etching in which plasma comprising oxygen is used.

20. The method of claim 17, wherein the passivation layer comprises Alq3(Tris(8-hydroxyquinolinato)aluminum).

21. The method of claim 17, wherein the passivation layer is larger than a corresponding one of the second electrodes so as to completely cover the corresponding one of the second electrodes.

* * * * *